United States Patent
Sasahara et al.

(10) Patent No.: US 9,971,244 B2
(45) Date of Patent: May 15, 2018

(54) PHOTOSENSITIVE ELEMENT, PHOTOSENSITIVE ELEMENT ROLL, METHOD FOR PRODUCING RESIST PATTERN, AND ELECTRONIC COMPONENT

(71) Applicant: HITACHI CHEMICAL COMPANY, LTD., Tokyo (JP)

(72) Inventors: Naoki Sasahara, Tokyo (JP); Ikuo Mukai, Tokyo (JP); Mayumi Sato, Tokyo (JP); Yasuhiro Seri, Tokyo (JP); Koji Abe, Tokyo (JP); Manami Kiryu, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days. days.

(21) Appl. No.: 14/786,461

(22) PCT Filed: Apr. 22, 2014

(86) PCT No.: PCT/JP2014/061307
§ 371 (c)(1),
(2) Date: Oct. 22, 2015

(87) PCT Pub. No.: WO2014/175274
PCT Pub. Date: Oct. 30, 2014

(65) Prior Publication Data
US 2016/0077434 A1    Mar. 17, 2016

(30) Foreign Application Priority Data
Apr. 24, 2013 (JP) ................. 2013-091227

(51) Int. Cl.
*G03F 7/11* (2006.01)
*G03F 7/34* (2006.01)
(Continued)

(52) U.S. Cl.
CPC .............. *G03F 7/11* (2013.01); *B32B 37/003* (2013.01); *G03C 1/805* (2013.01); *G03F 7/027* (2013.01);
(Continued)

(58) Field of Classification Search
CPC .......... G03D 1/805; G03F 7/34; G03F 7/343; G03C 1/805
(Continued)

(56) References Cited

U.S. PATENT DOCUMENTS 4,147,549 A * 4/1979 Held ........................ G03F 7/032
101/453
5,024,909 A * 6/1991 Smothers ................ G03F 7/001
359/28
(Continued)

FOREIGN PATENT DOCUMENTS

JP   2000-147755 A   5/2000
JP   2000-330291 A   11/2000
(Continued)

OTHER PUBLICATIONS

International Search Report for PCT/JP2014/061307 dated Jun. 3, 2014; English Translation submitted herewith (5 pages).
(Continued)

*Primary Examiner* — John S Chu
(74) *Attorney, Agent, or Firm* — Fitch, Even, Tabin & Flannery, LLP

(57) ABSTRACT

A photosensitive element 1 comprises a support film 10, a protective film (polypropylene film) 30, and a photosensitive layer 20 which is arranged between the support film 10 and the protective film 30, wherein the protective film 30 has a principal surface 30a at a side of the photosensitive layer 20 and a principal surface 30b at an opposite side of the
(Continued)

principal surface 30a, and the principal surface 30a and the principal surface 30b are smooth.

18 Claims, 17 Drawing Sheets

(51) Int. Cl.
G03C 1/805 (2006.01)
G03F 7/027 (2006.01)
B32B 37/00 (2006.01)
G03F 7/16 (2006.01)
G03F 7/20 (2006.01)
H05K 3/28 (2006.01)
H05K 3/00 (2006.01)
H05K 3/46 (2006.01)

(52) U.S. Cl.
CPC ............... *G03F 7/161* (2013.01); *G03F 7/20* (2013.01); *G03F 7/34* (2013.01); *G03F 7/343* (2013.01); *B32B 2457/208* (2013.01); *G06F 2203/04103* (2013.01); *H05K 3/0079* (2013.01); *H05K 3/28* (2013.01); *H05K 3/4685* (2013.01); *H05K 2203/066* (2013.01)

(58) Field of Classification Search
USPC ....................... 430/253, 254, 262, 263, 273.1
See application file for complete search history.

(56) References Cited

U.S. PATENT DOCUMENTS

| | | | | |
|---|---|---|---|---|
| 2009/0186293 | A1* | 7/2009 | Fannin | B41J 2/1603 430/270.1 |
| 2009/0297982 | A1* | 12/2009 | Saitou | G03F 7/031 430/286.1 |
| 2015/0331188 | A1* | 11/2015 | Maeda | G02B 6/132 385/131 |

FOREIGN PATENT DOCUMENTS

| | | |
|---|---|---|
| JP | 2004-125869 A | 4/2004 |
| JP | 2004-191648 A | 7/2004 |
| JP | 2009-116078 A | 5/2009 |
| JP | 2009-128759 A | 6/2009 |
| JP | 2010-079089 A | 4/2010 |
| JP | 2011-076104 A | 4/2011 |
| JP | 2012-252328 A | 12/2012 |

OTHER PUBLICATIONS

International Preliminary Report on Palatability for PCT/JP2014/061307 dated Oct. 27, 2015 (5 pages).
Written Opinion of the International Search Authority for PCT/JP2014/061307 dated Jun. 3, 2014; English Translation submitted herewith (9 pages).

* cited by examiner

[Fig. 1]

[Fig. 4]
(a)
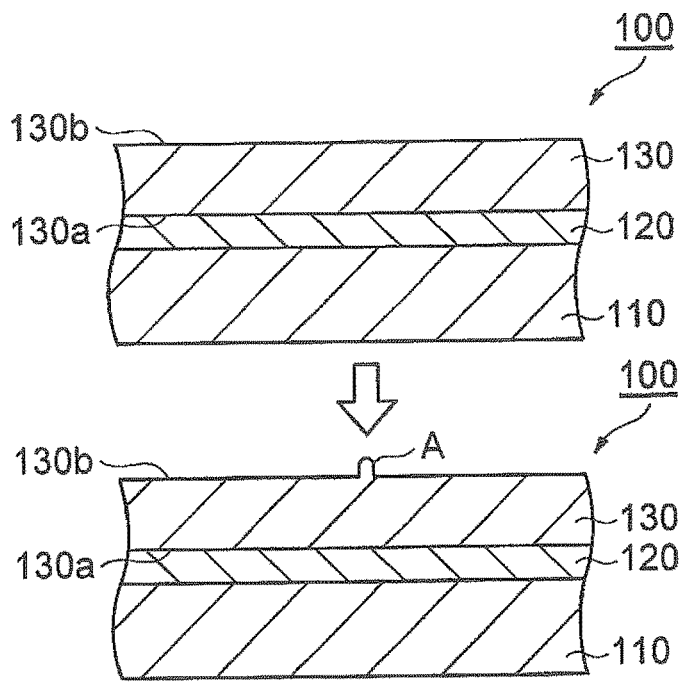
(b)
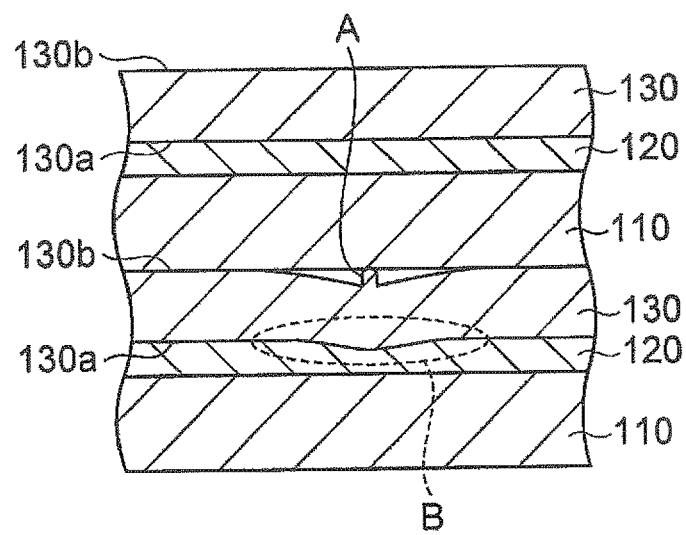

[Fig.5]
(a)
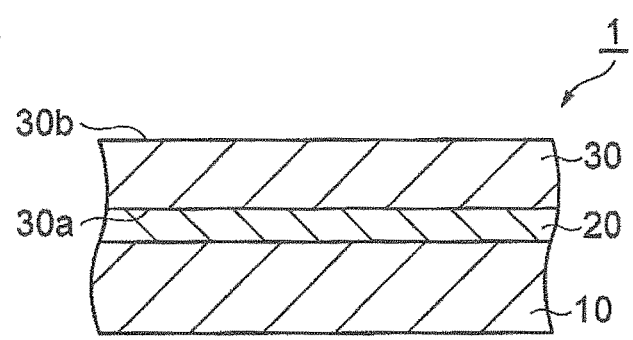
(b)
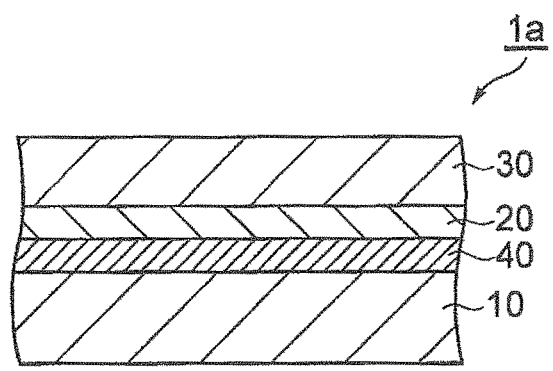

[Fig. 6]
(a)
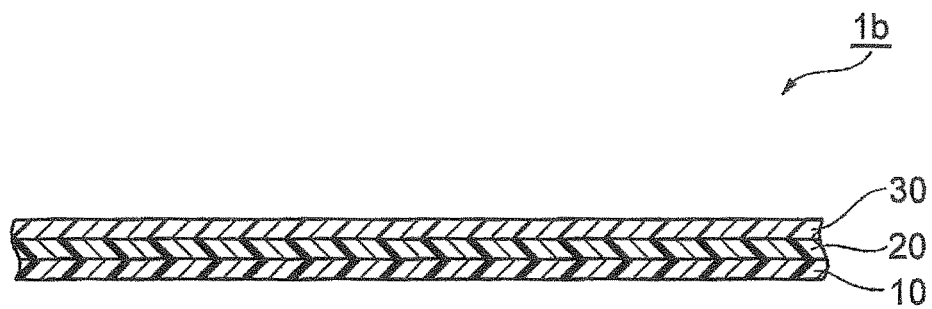
(b)
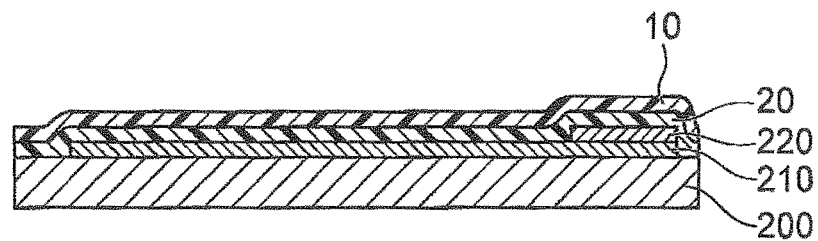

[Fig. 7]
(a)
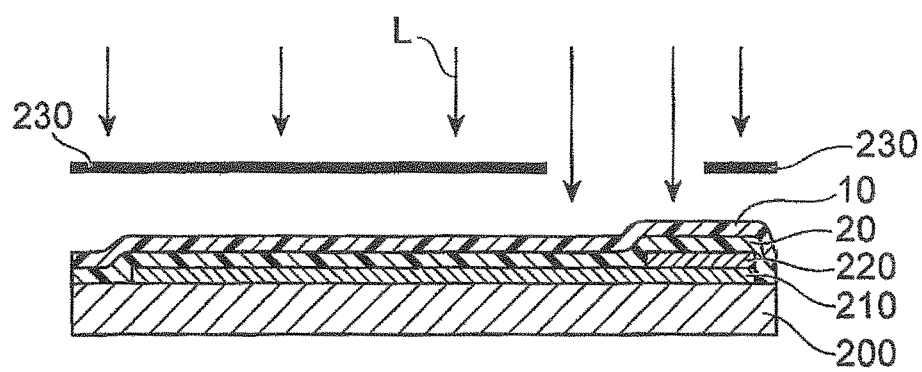
(b)
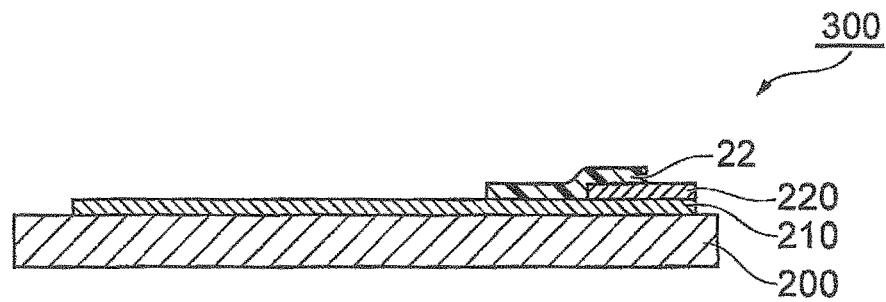

[Fig. 8]
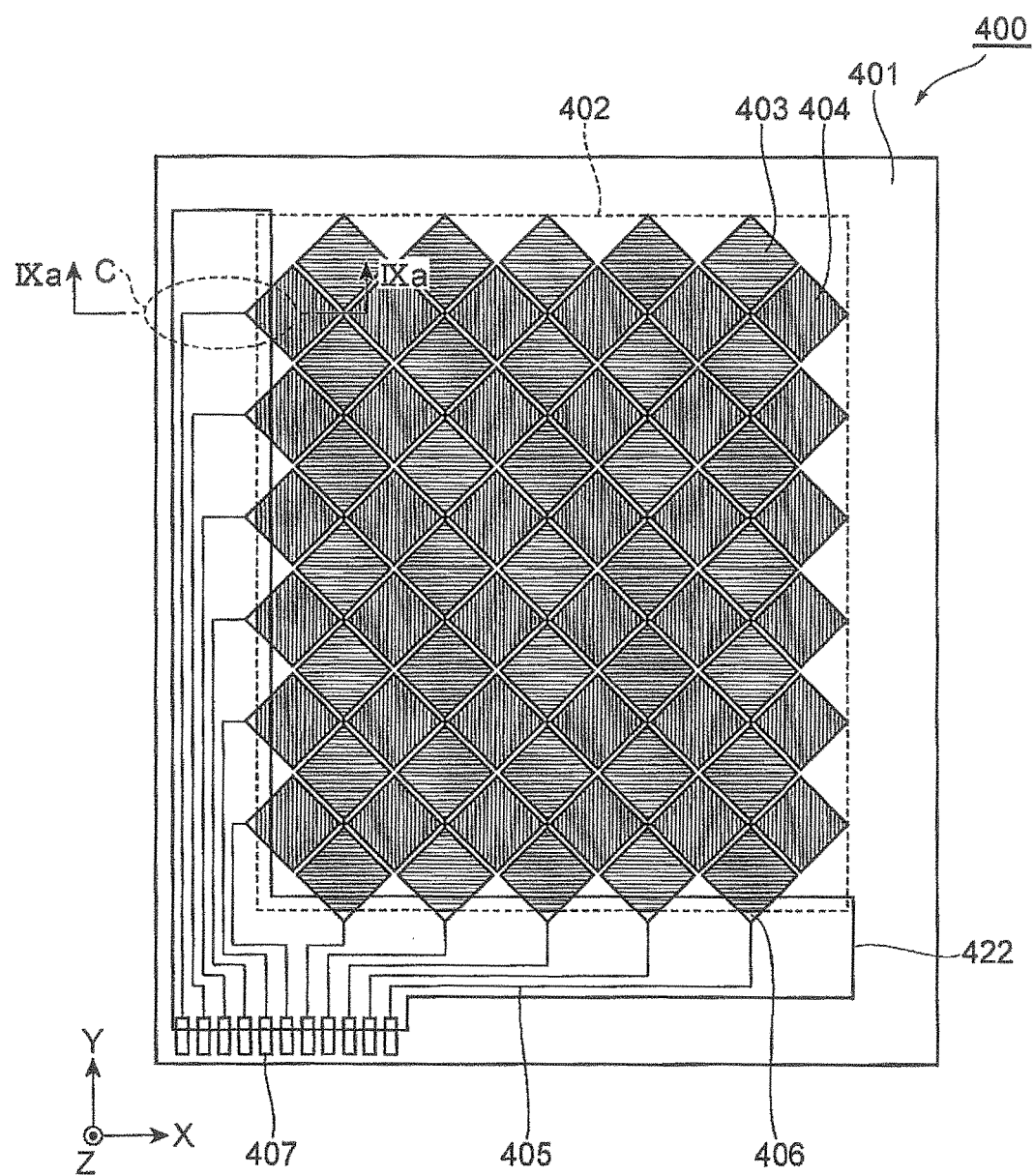

[Fig. 9]
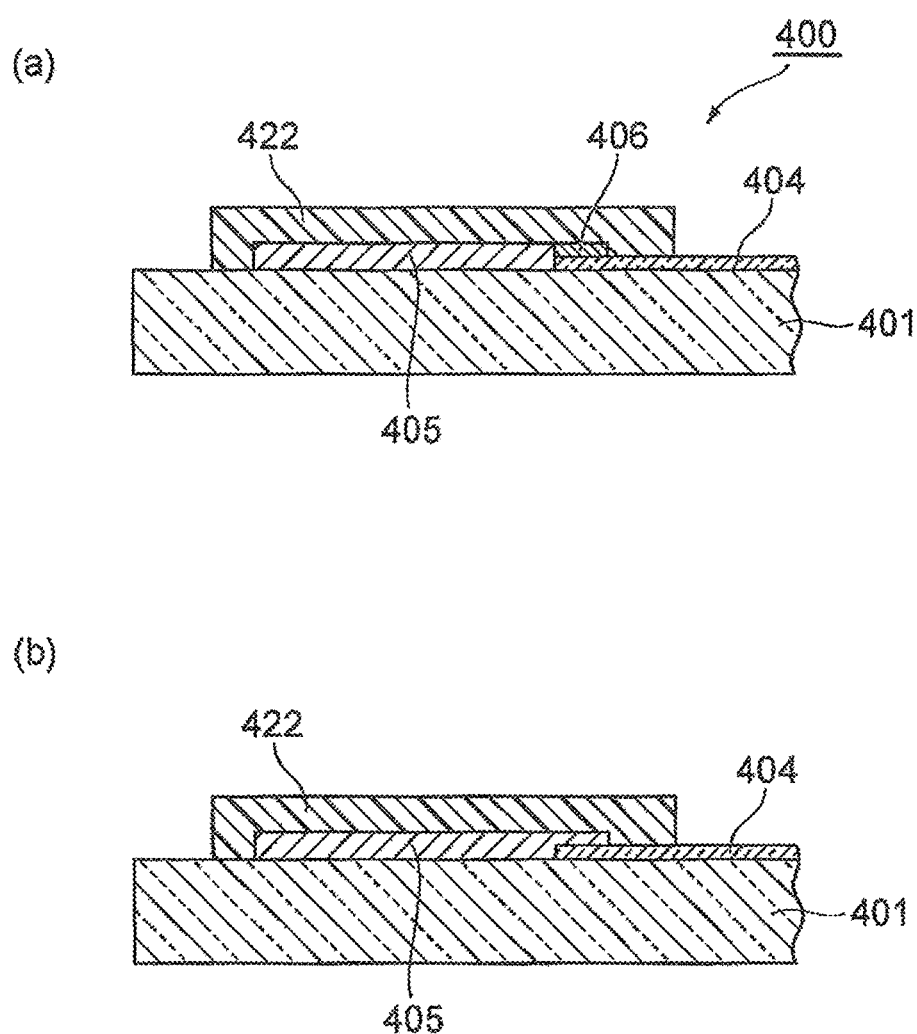

[Fig.10]
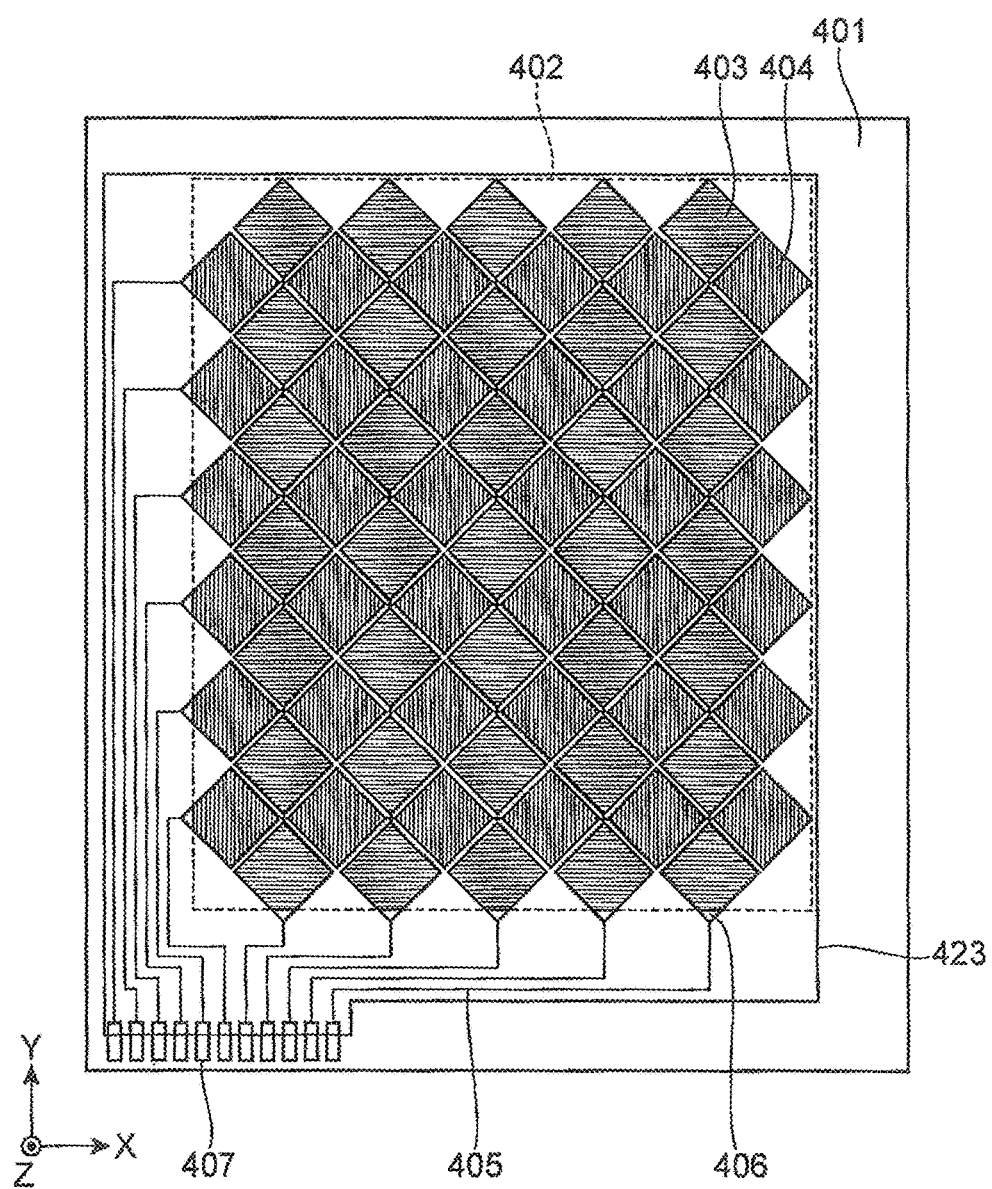

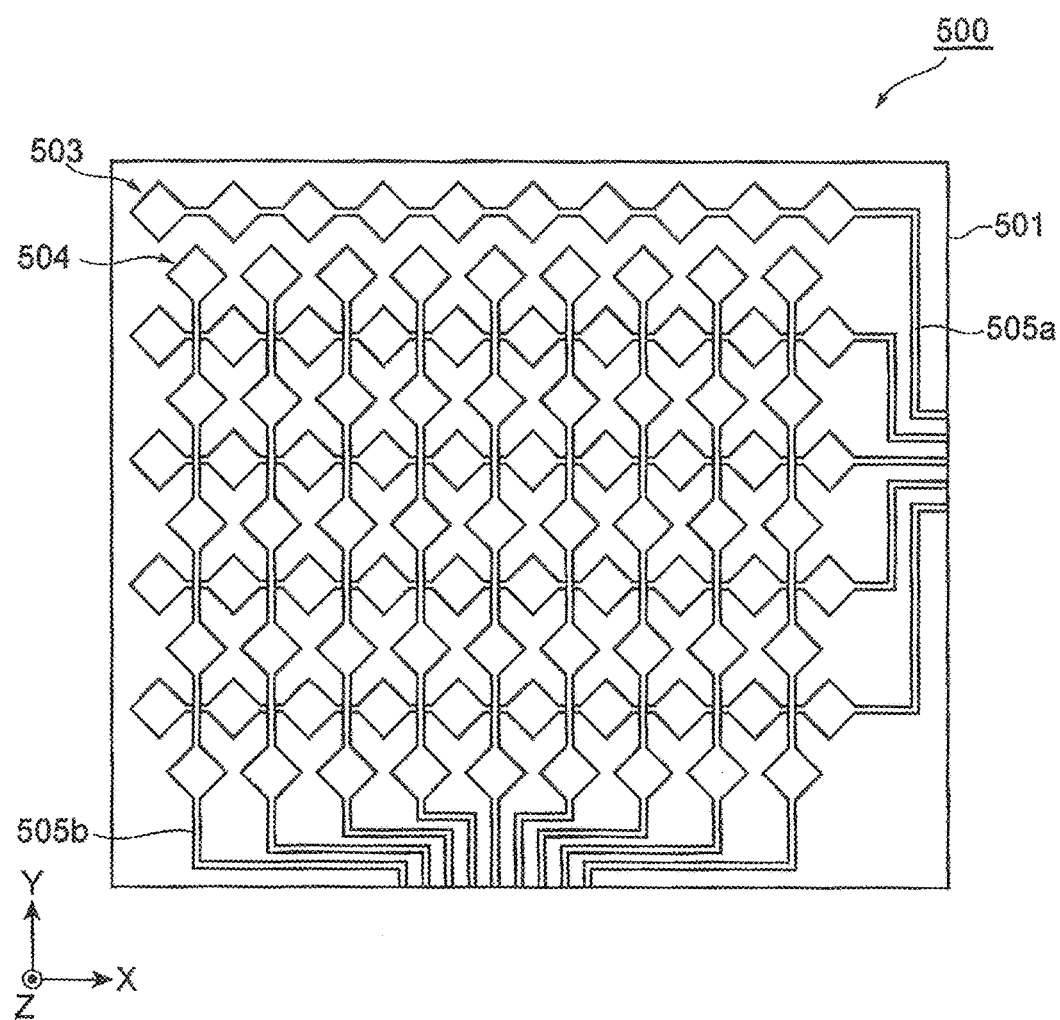
[Fig. 11]

[Fig.12]
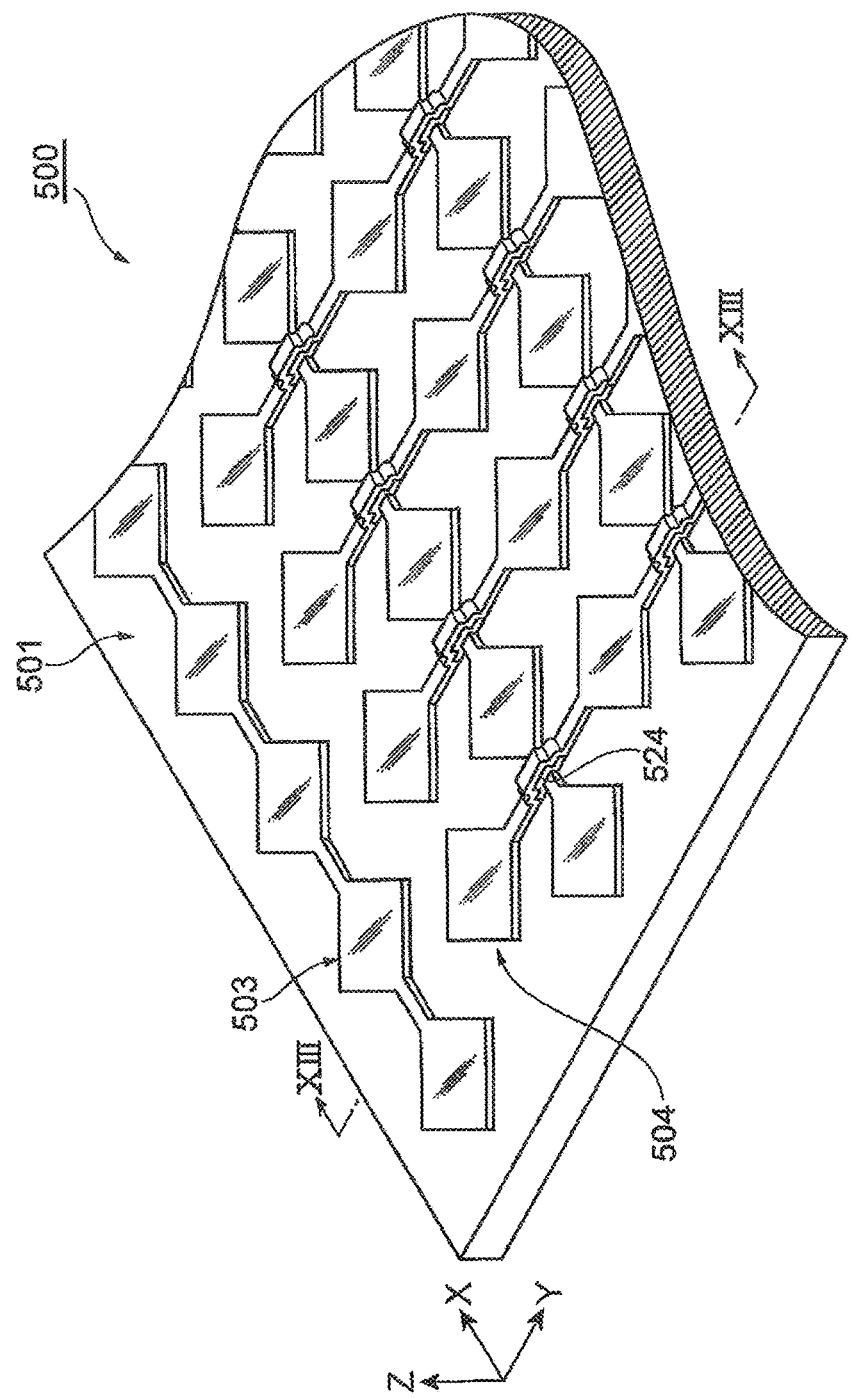

[Fig. 13]
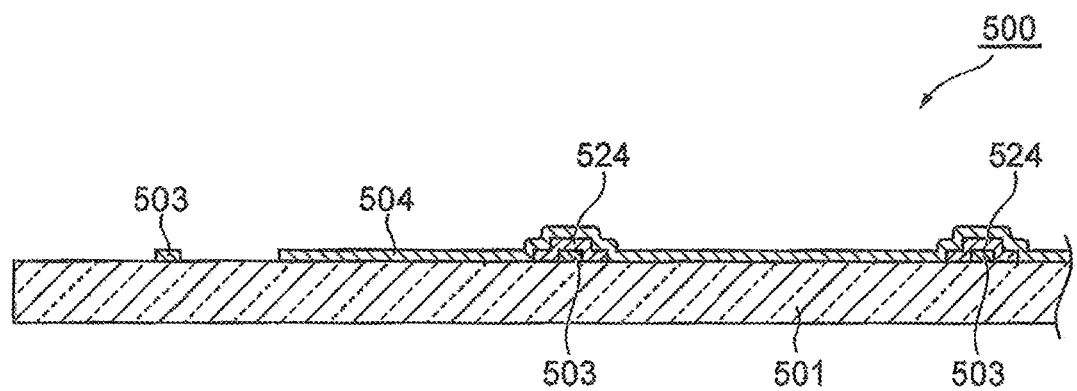

[Fig. 14]
(a)
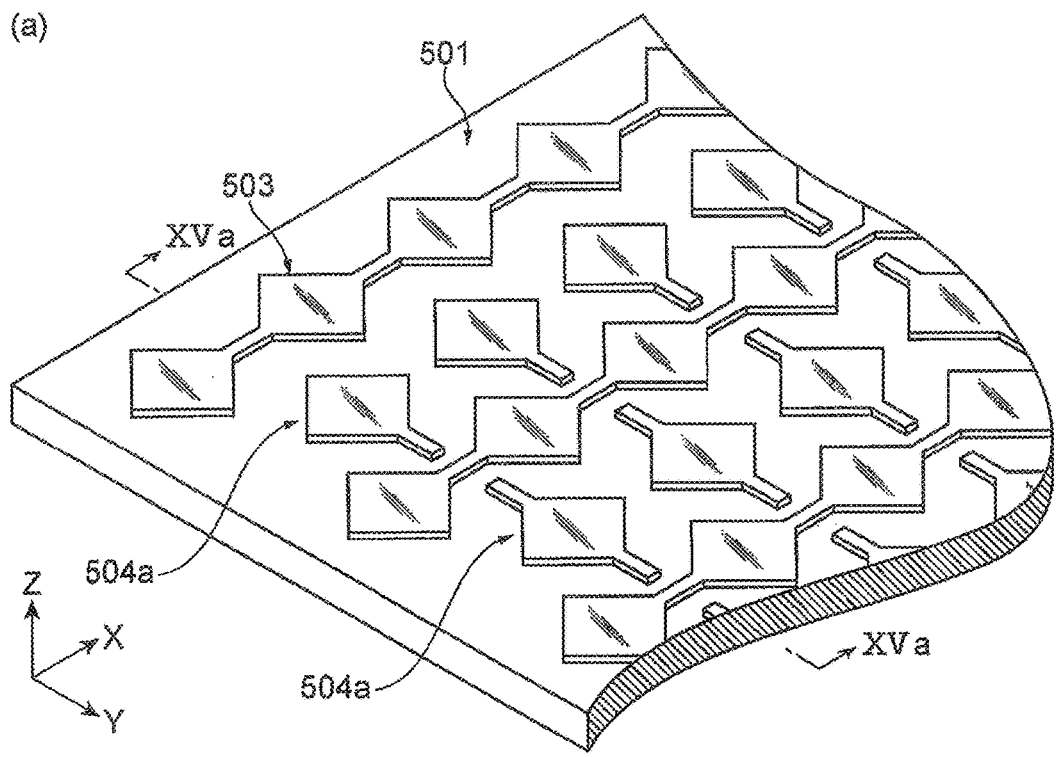
(b)
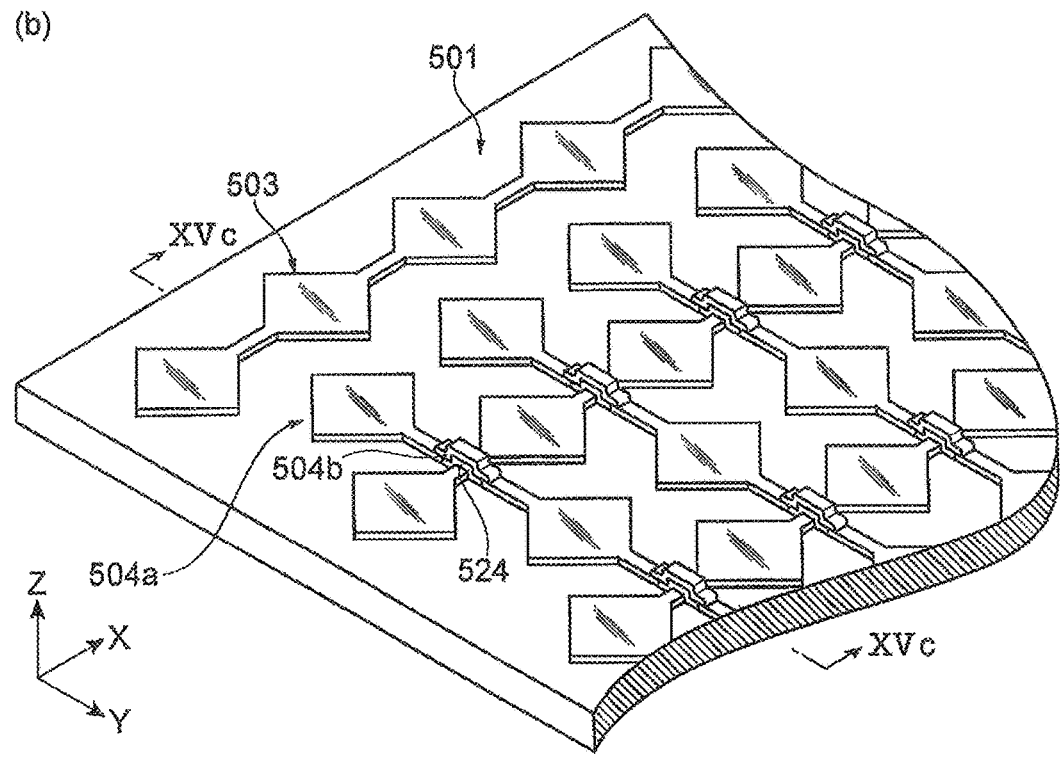

[Fig. 15]
(a)
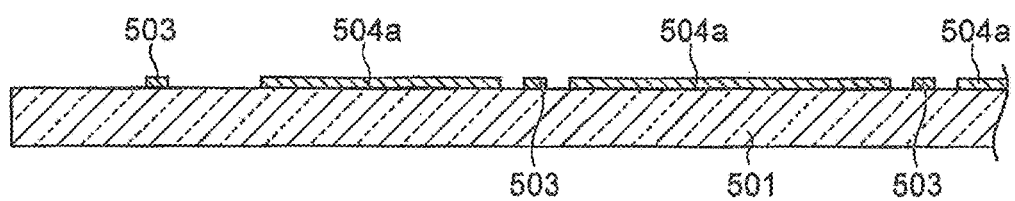
(b)
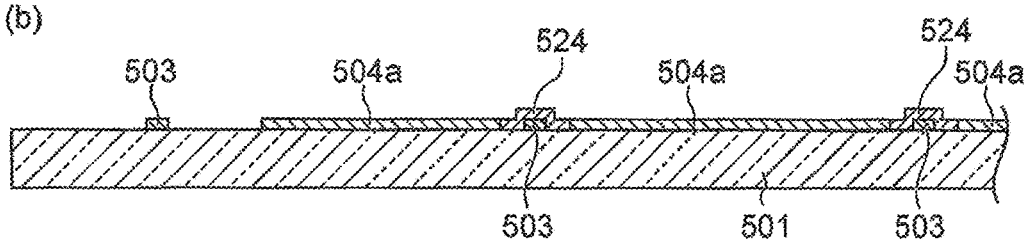
(c)
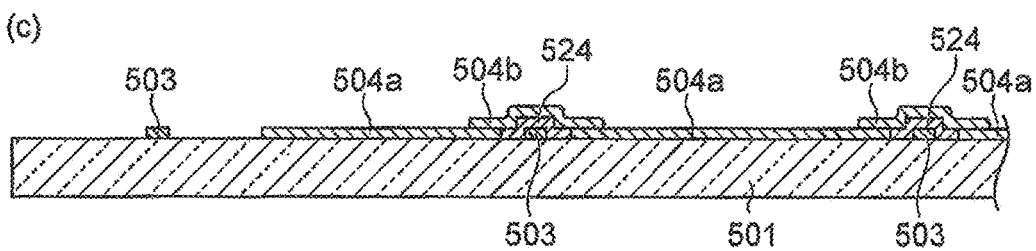

[Fig. 16]
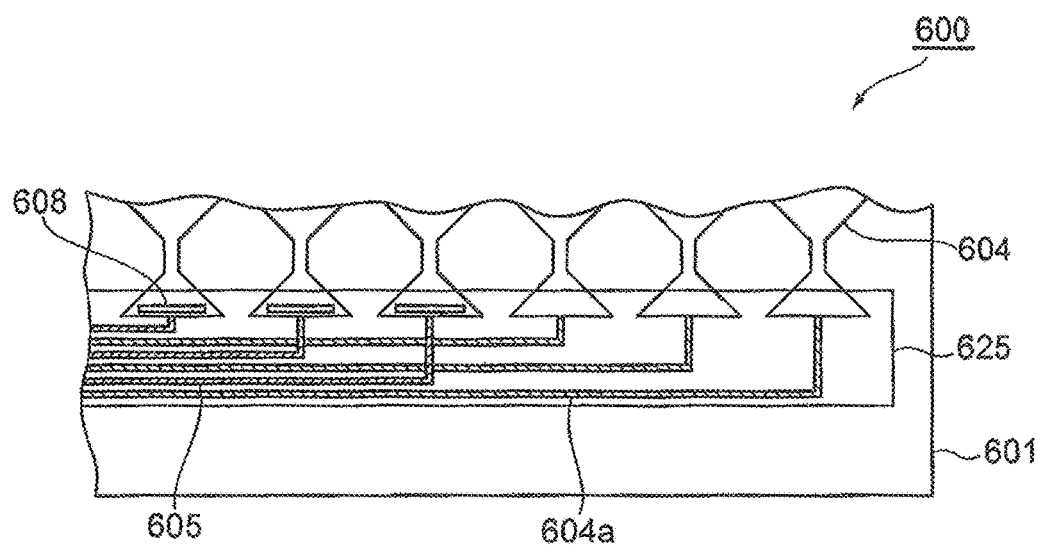

*Fig.17*
(a)
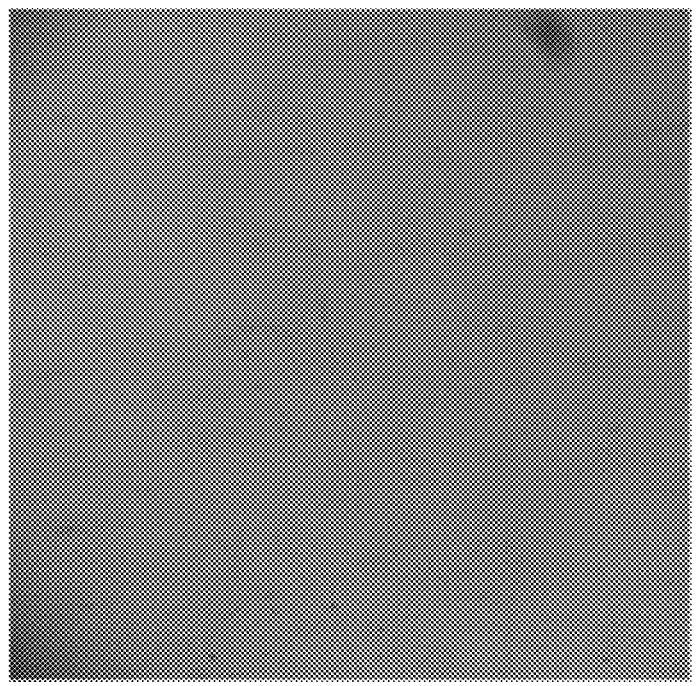
(b)
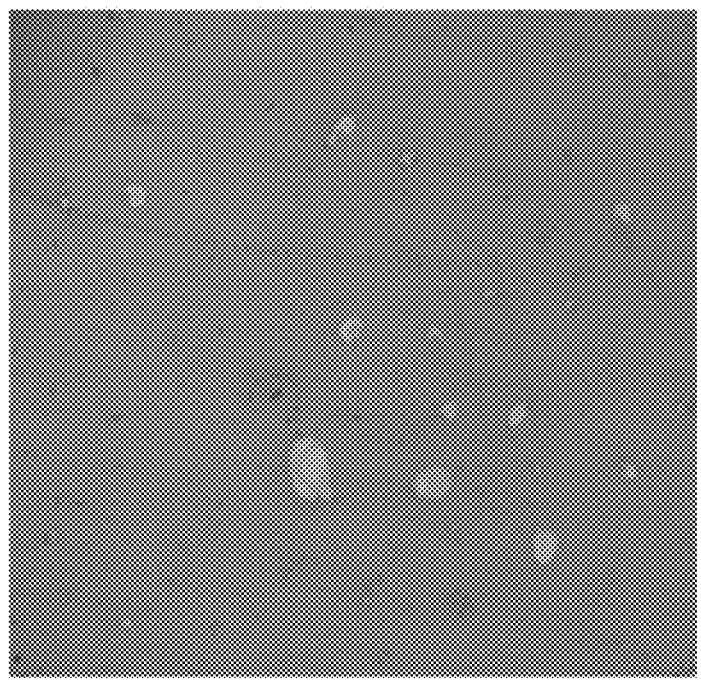

PHOTOSENSITIVE ELEMENT, PHOTOSENSITIVE ELEMENT ROLL, METHOD FOR PRODUCING RESIST PATTERN, AND ELECTRONIC COMPONENT

TECHNICAL FIELD

The present invention relates to a photosensitive element, a photosensitive element roll, a method for producing a resist pattern, and an electronic component.

BACKGROUND ART

The photosensitive element is used mainly for forming a circuit on a printed wiring board. In addition, the photosensitive element is also used in the formation of an insulating film for protecting the circuit on the printed wiring board, in the formation of a spacer for keeping a gap between liquid crystal layers in a liquid crystal display device constant, and in the like.

The photosensitive element usually has a three-layer structure of a support film, a photosensitive layer and a protective film. The photosensitive element is used in the following way, for instance. Firstly, the protective film of the photosensitive element is peeled off, and then the photosensitive layer which contains a photosensitive resin composition is laminated on a substrate (lamination step). Next, a predetermined portion of the photosensitive layer is irradiated with active rays from the support film side to form a photo-cured portion (light exposure step). After that, the support film is peeled and removed, then an unexposed portion is removed (developed) from the substrate, and thereby a resist pattern, which is composed of a cured product of the photosensitive resin composition, is formed on the substrate (development step).

The obtained resist pattern can be used for an insulating film, a spacer or the like, and can also be used as a mask for forming a circuit by plating treatment or etching treatment for the resist pattern.

By the way, in the present technical field, it is known that there is the case where the shape of the contact surface with the photosensitive layer in the protective film is transferred onto the photosensitive layer. For instance, in the following Patent Document 1, it is shown that the air void, which occurs when the photosensitive layer is laminated, is reduced by adjusting a surface roughness (Ra) of the contact surface with the photosensitive layer in the protective film to 0.15 μm or less, and also by reducing the number of fisheyes which are contained in the protective film and have a diameter of 80 μm or more to 5 pieces/m² or less.

In addition, in the following Patent Document 2, it is shown that the followability to an uneven substrate is enhanced by adjusting the surface roughness (Ra) of the protective film to 0.5 μm or more, and making the shape disappear by pressurization at the time of the lamination.

Furthermore, in the following Patent Document 3, it is shown that a photosensitive layer, in which there is no occurrence of the air void, can be laminated on a base material which is used for photo-nanoimprint and has fine unevenness thereon, by adjusting the Ra of the contact surface with the photosensitive layer in the protective film to 0.05 to 0.5 μm, in a photosensitive element which transfers the fine unevenness having the surface roughness of 0.01 to 2 μm.

CITATION LIST

Patent Literature

[Patent Document 1] Japanese Patent Application Laid-Open No. 2000-330291
[Patent Document 2] Japanese Patent Application Laid-Open No. 2000-147755
[Patent Document 3] Japanese Patent Application Laid-Open No. 2009-128759

SUMMARY OF INVENTION

Technical Problem

In recent years, as electronic components become denser and become more highly functionalized, a photosensitive element having a thin photosensitive layer is demanded. If a conventional photosensitive element is used when the photosensitive layer of the photosensitive element having such a thin photosensitive layer is laminated on a substrate, there is the case where an air bubble in laminate is formed. Therefore, a photosensitive element which can sufficiently suppress the occurrence of the air bubble in laminate and a method for producing a resist pattern using the same are demanded.

The present invention intends to solve the above described problems, and an object of the present invention is to provide a photosensitive element which can suppress the occurrence of the air bubble at the time of the lamination, even when the photosensitive element has a thin photosensitive layer. In addition, another object of the present invention is to provide a photosensitive element roll which has the photosensitive element, a method for producing a resist pattern using the photosensitive element, and an electronic component obtained by using the photosensitive element.

Solution to Problem

A first embodiment of the present invention provides a photosensitive element comprising: a support film; a polypropylene film; and a photosensitive layer which is arranged between the support film and the polypropylene film, wherein the polypropylene film has a first surface at a side of the photosensitive layer and a second surface at an opposite side to the first surface, and the first surface and the second surface are smooth.

Incidentally, in the present specification, "first surface and second surface are smooth" for the polypropylene film is defined to be that when the polypropylene film of the photosensitive element is peeled which is wound around a core, then a laminated product (film to be evaluated) F1 having the support film and the photosensitive layer is transferred to a polyethylene terephthalate film which is an adherend (PET film: widths of support film and photosensitive layer are 99% of width of PET film) F2 so that the photosensitive layer of 500 mm comes in contact with the PET film (lamination temperature of 90° C. and lamination speed of 2.0 m/minute), as is shown in FIG. 1, and then three predetermined measurement regions (Regions A1, A2 and A3 with 1 cm×1 cm shown in FIG. 1. Region A1: central part in length direction and width direction in whole photosensitive layer, region A2: central part in one region out of four regions partitioned by dividing photosensitive layer into two regions in each of length direction and width direction, and region A3: central part in region in diagonal position to region A2.) on a surface of the photosensitive layer, which does not come in contact with the PET film (adherend) F2, (surface of photosensitive layer, which comes in contact with support film), are observed with a microscope (20-times object lens), the average number of air bubbles having a diameter of 10 μm or more is two pieces or less.

A second embodiment of the present invention provides a photosensitive element comprising: a support film; a polypropylene film; and a photosensitive layer which is arranged between the support film and the polypropylene film, wherein the polypropylene film has a first surface at a side of the photosensitive layer and a second surface at an opposite side to the first surface, and an arithmetic mean roughness Ra of the first surface and the second surface is 0.05 μm or less.

A third embodiment of the present invention provides a photosensitive element which has a support film, a polypropylene film, and a photosensitive layer that is arranged between the support film and the polypropylene film, wherein the polypropylene film has a first surface at a side of the photosensitive layer and a second surface at an opposite side to the first surface, and a maximum height Rmax of the first surface and the second surface is 0.5 μm or less.

The present inventors have made an investigation on the air bubble in detail, which occurs when the photosensitive element is laminated on a base material (substrate or the like). Firstly, they used a photosensitive element which had a protective film having unevenness on both of the surfaces thereof, peeled the protective film, then laminated the photosensitive element, and as a result, found out that a fibril-like air bubble occurred without depending on the composition of the photosensitive layer (see FIG. 2). The present inventors made various investigations on the reason why the above described fibril-like air bubble occurred, and as a result, found out that such a factor of causing the air bubble originated in a shape of the projection which existed on the surface of the protective film having the unevenness on both of the surfaces.

Next, an investigation was made by using a photosensitive element in which the protective film of which the one surface is smooth was laminated so that the smooth surface of the protective film came in contact with the photosensitive layer, while making the use of the knowledge in the above described Patent Documents 1 to 3. However, the present inventors found out that, even when such a method was used, a circular air bubble resulted in occurring in the lamination step (see FIG. 3).

The present inventors made an investigation including the above described result, and as a result, found out that, when the photosensitive element was used in which the photosensitive layer and the protective film were laminated on each other, the shape of the surface of the protective film, which did not come in contact with the photosensitive layer, contributed to the formation of the unevenness on the photosensitive layer. When the unevenness is formed on the photosensitive layer in this manner, it becomes a factor of causing the air bubble in laminate.

In addition, in the protective film of the above described patent document 1, which was used for obtaining the above described knowledge, the number of the fisheyes having a diameter of 80 μm or more was 5 pieces or less per 1 m². However, it is confirmed that, even when such a protective film is used, the air bubble in laminate occurs. On the other hand, it is confirmed that, even when the protective film is used in which 1000 or more fisheyes each having a diameter of 80 μm or more exist per 1 m², the air bubble does not occur in the laminate in some cases. Specifically, the present inventors found out that the air bubble in laminate occurred due to the shape of both of the surfaces of the protective film, regardless of the existence of the fisheye.

The reason why the shape of the surface of the protective film, which does not come in contact with the photosensitive layer, contributes to the formation of the unevenness on the photosensitive layer is not necessarily clear, but the present inventors guess the reason in the following way.

Specifically, the photosensitive element is usually wound around a core having a cylindrical shape or the like, and is stored in a rolled form. A photosensitive element 100 shown in FIG. 4 has a support film 110, a photosensitive layer 120 which is laminated on the support film 110, and a protective film 130 which is laminated on the photosensitive layer 120. The protective film 130 has a principal surface 130a at a side of the photosensitive layer 120, and a principal surface 130b at an opposite side to the principal surface 130a. When the photosensitive element 100 is stored, the photosensitive element 100 is wound so that the support film 110 is arranged at the most outer side (lower side in FIG. 4).

It is guessed that, when the photosensitive element 100 is wound around the core, unevenness A existing on the principal surface 130b of the protective film 130, which does not come in contact with the photosensitive layer 120, is pushed by the support film 110, a part or all of the unevenness A is transferred onto the photosensitive layer 120, and thereby unevenness B is formed on the photosensitive layer 120.

In contrast to this, the photosensitive element according to the present invention can suppress the occurrence of the air bubble at the time of the lamination, even when the photosensitive element has a thin photosensitive layer.

A factor by which such an effect is obtained is guessed to be as described below. However, the factor is not limited to the following description. Specifically, in the photosensitive element according to the present invention, the first surface at the photosensitive layer side is smooth, and in addition, the second surface is also smooth. Therefore, when the photosensitive element is wound around the core, it is suppressed that the shape of the second surface is transferred onto the photosensitive layer, and accordingly it can be suppressed that the unevenness which becomes a factor of the air bubble in the lamination is formed on the photosensitive layer. Thereby, it is guessed that the occurrence of the air bubble at the time of the lamination can be suppressed.

By the way, there is such a problem that, if the air bubble in laminate occurs when the thin photosensitive layer of the photosensitive element having the photosensitive layer is laminated on the base material, the reliability of an electronic component is impaired that mounts the cured product (particularly as permanent resist such as insulating film, spacer and protective member of touch panel, and the like) which is obtained by using such a photosensitive element. On the other hand, the photosensitive element according to the present invention can suppress the occurrence of the air bubble at the time of the lamination, even when the photosensitive element has the thin photosensitive layer, and accordingly can enhance the reliability of the electronic component that mounts the cured product (resist pattern and the like) which is obtained by using the photosensitive element according to the present invention.

The thickness of the photosensitive layer in the photosensitive element according to the present invention is preferably less than 20 μm. The photosensitive element having such a thin photosensitive layer occasionally shows a behavior different from that of a photosensitive element which has a photosensitive layer having a thickness of 20 μm or more, but the photosensitive element according to the present invention can suppress the occurrence of the air bubble at the time of the lamination, even when the photosensitive layer is a thin layer like this.

The present inventors have found out that the phenomenon that the shape of the surface of the protective film, which does not come in contact with the photosensitive layer, contributes to the formation of the unevenness on the photosensitive layer occurs particularly remarkably when the thickness of the photosensitive layer is 10 µm or less. It is guessed that the above described phenomenon occurs due to a factor that the photosensitive layer becomes thin and the volume of the photosensitive layer becomes small. On the other hand, in the photosensitive element according to the present invention, the thickness of the photosensitive layer may be 10 µm or less. The photosensitive element according to the present invention can suppress the occurrence of the air bubble at the time of the lamination, even when the photosensitive element having the photosensitive layer of 10 µm or less has been used.

The average light transmittance of the photosensitive element according to the present invention may be 80% or more in a wavelength region of the 400 to 700 nm. In this case, the photosensitive element can be preferably used for application for a touch panel in which transparency is required, and the like.

The photosensitive layer may contain a binder polymer, a photopolymerizable compound and a photopolymerization initiator.

The photosensitive element according to the present invention may be used for forming a cured product on a transparent base material.

A fourth embodiment of the present invention provides a photosensitive element roll comprising a core, and a photosensitive element which is wound around the core, wherein the photosensitive element is the photosensitive element according to the present invention.

A fifth embodiment of the present invention provides a method for producing a resist pattern, comprising: a step of peeling the polypropylene film of the photosensitive element according to the present invention, and then laminating the photosensitive layer and the support film on a base material; a step of irradiating a predetermined portion of the photosensitive layer with active rays to form a photo-cured portion; and a step of removing a portion other than the photo-cured portion in the photosensitive layer.

A sixth embodiment of the present invention provides an electronic component comprising a resist pattern which is obtained by the method for producing the resist pattern according to the present invention. In addition, a seventh embodiment of the present invention provides an electronic component comprising a cured product of the photosensitive layer of the photosensitive element according to the present invention.

Advantageous Effects of Invention

According to the present invention, it is possible to suppress the occurrence of an air bubble at the time of lamination, even when the photosensitive element has a thin photosensitive layer. Thereby, it is possible to enhance the reliability of an electronic component which mounts a cured product (resist pattern and the like) that is obtained by using the photosensitive element according to the present invention. For instance, by using the above described photosensitive element for obtaining the cured product (in particular, permanent resist such as insulating film, spacer, and protective member of touch panel, and the like).

The present invention can provide the application of a photosensitive element for forming a cured product (in particular, permanent resist such as insulating film, spacer, and protective member of touch panel, and the like). The present invention can provide the application of a photosensitive element for manufacturing an electronic component. For instance, the present invention can provide the application of the photosensitive element for forming the cured product of the electronic component having the cured product (protective member and the like). The present invention can provide the application of the photosensitive element for forming the cured product (for instance, resist pattern such as resin cured product pattern) on a base material (for instance, transparent base material). The present invention can provide the application of the photosensitive element for manufacturing the touch panel. For instance, the present invention can provide the application of the photosensitive element for forming the protective film (for instance, resist pattern such as resin cured product pattern) on a base material for the touch panel.

BRIEF DESCRIPTION OF DRAWINGS

FIG. 4 is a schematic sectional view for describing an assumed mechanism to generate the air bubble.

FIG. 5 is a schematic sectional view showing a photosensitive element according to an embodiment of the present invention.

FIG. 6 is a schematic sectional view for describing a method for manufacturing an electronic component according to one embodiment of the present invention.

FIG. 7 is a schematic sectional view for describing a method for manufacturing the electronic component according to one embodiment of the present invention.

FIG. 8 is a schematic plan view showing an electronic component according to one embodiment of the present invention.

FIG. 9 is a partial sectional view showing the electronic component according to one embodiment of the present invention.

FIG. 10 is a schematic plan view showing the electronic component according to one embodiment of the present invention.

FIG. 11 is a schematic plan view showing an electronic component according to one embodiment of the present invention.

FIG. 12 is a partial cutaway perspective view of FIG. 11.

FIG. 13 is a partial sectional view taken along the line XIII-XIII of FIG. 12.

FIG. 14 is a partial cutaway perspective view for describing a method for manufacturing the electronic component according to one embodiment of the present invention.

FIG. 15 is a partial sectional view for describing a method for manufacturing the electronic component according to one embodiment of the present invention.

FIG. 16 is a partial plan view showing an electronic component according to one embodiment of the present invention.

FIG. 17 is a microscope photograph showing an evaluation result of the air bubble in laminate.

DESCRIPTION OF EMBODIMENTS

Figure 1:
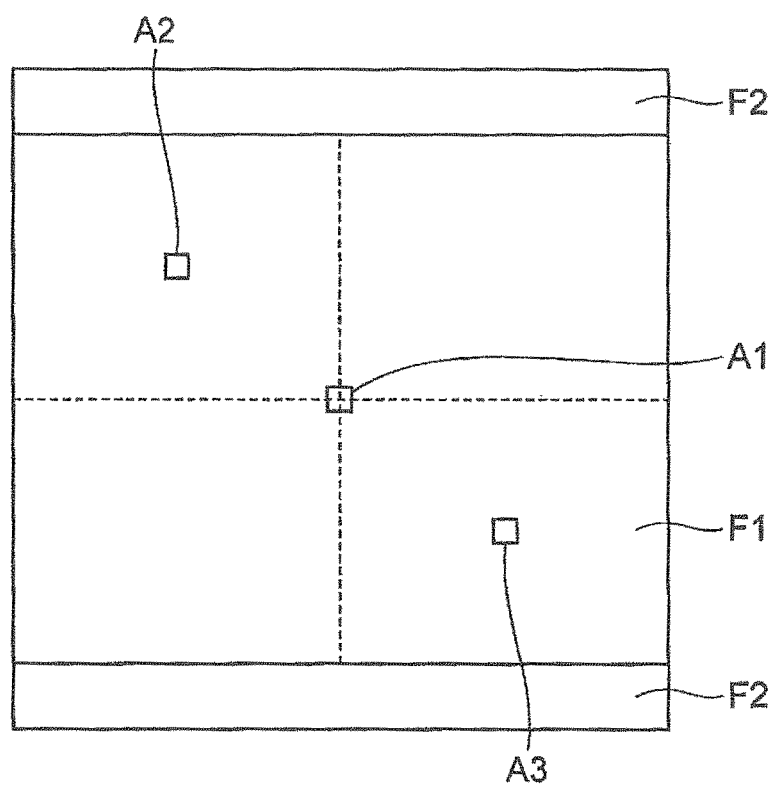
FIG. 1 is a schematic view for describing a method for evaluating smoothness.
Figure 2:
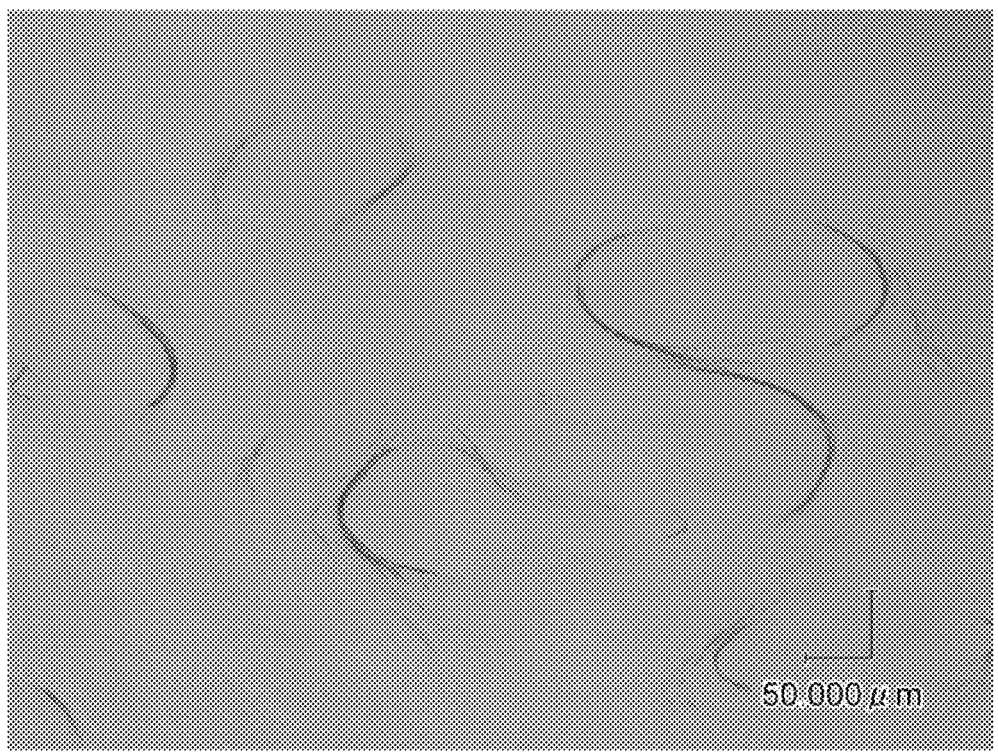
FIG. 2 is an SEM photograph showing a fibril-shaped air bubble.
Figure 3:
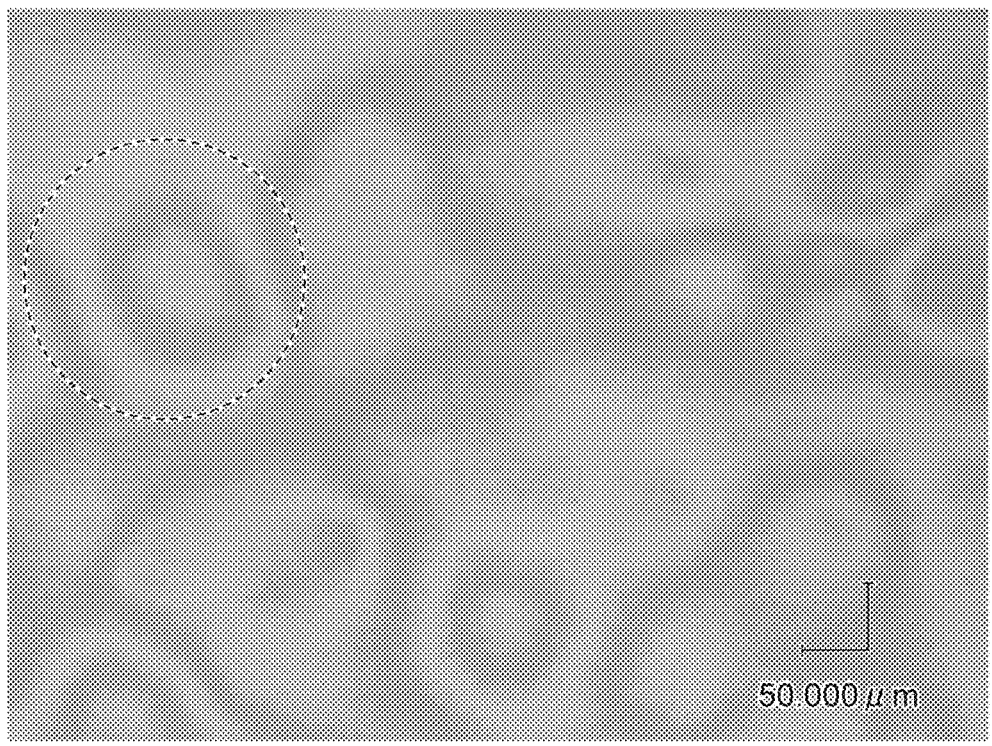
FIG. 3 is an SEM photograph showing a circular air bubble.

Embodiments of the present invention will be described in detail below. However, the present invention is not limited to the following embodiments, but various changes can be made within a range of the scope.

In the present specification, "(meth)acrylic acid" means acrylic acid or methacrylic acid, "(meth)acrylate" means acrylate or methacrylate, and "(meth)acrylic resin" means an acrylic resin or a methacrylic resin.

(Photosensitive Element)

The photosensitive element according to the present embodiment has a support film, a polypropylene film, and a photosensitive layer which is arranged between the support film and the polypropylene film, wherein the polypropylene film has a first surface at the side of the photosensitive layer and a second surface at the opposite side to the first surface, and at least one of the followings (I) to (III) is satisfied.

(I) The first surface and the second surface are smooth.

(II) The arithmetic mean roughness Ra of the first surface and the second surface is 0.05 µm or less.

(III) The maximum height Rmax of the first surface and the second surface is 0.5 µm or less.

The photosensitive element according to the present embodiment will be further described below. FIG. 5 is a schematic sectional view showing a photosensitive element according to the present embodiment. The photosensitive element 1 shown in FIG. 5(a) is a photosensitive element which is prepared by laminating (A) a support film 10, (B) a photosensitive layer (photosensitive resin composition layer) 20, and (C) a protective film 30. The photosensitive layer 20 is arranged between the support film 10 and the protective film 30. The photosensitive element 1 has the support film 10, the photosensitive layer 20 and the protective film 30, in this order in a lamination direction.

The support film 10 can employ a polymer film, and is preferably a polymer film having heat resistance and solvent resistance. Examples of such a polymer film include: polyester films such as a polyethylene terephthalate film; polyolefin films such as a polyethylene film and a polypropylene film; and polycarbonate films. Among these, the polyethylene terephthalate film is preferable, from the viewpoint of being excellent in transparency and heat resistance.

Examples of the support film 10 include: Tetron (brand name) film G2 series, HS series, 03 series, and Mylar film D series made by Teijin DuPont Films Japan Limited; Lumirror FB50 series made by Toray Industries, Inc.; and Cosmo Shine series made by TOYOBO CO., LTD.

The thickness of the support film 10 is preferably 1 µm or more, and more preferably 12 µm or more, from the viewpoint of suppressing the occurrence of such a problem that the support film is broken at the time of coating, by suppressing the lowering of the mechanical strength. The thickness of the support film 10 is preferably 100 µm or less, and more preferably 25 µm or less, from the viewpoint of suppressing the lowering of the resolution and also suppressing a rise in the price.

The photosensitive layer 20 contains a photosensitive resin composition. The photosensitive resin composition is not limited in particular as long as it has photosensitivity, but the examples include compositions which contain (a) a binder polymer, (b) a photopolymerizable compound and (c) a photopolymerization initiator.

Examples of the (a) component include (meth)acrylic resins, styrene resins, epoxy resins, amide resins, amide epoxy resins, alkyd resins and phenol resins. The (a) component can be used solely or in combination with other one or more types. Among these, the (a) component is preferably (meth)acrylic resins, from the viewpoint of being excellent in alkali development properties. The (a) component has, for instance, a constitutional unit derived from a photopolymerizable monomer, and can be produced by subjecting the photopolymerizable monomer to polymerization (for instance, radical polymerization).

Examples of the photopolymerizable monomers include: styrene and polymerizable styrene derivatives in which an α-site or an aromatic ring is substituted such as vinyltoluene; (meth)acrylic acid; alkyl (meth)acrylic acid esters such as methyl (meth)acrylate, ethyl (meth)acrylate, propyl (meth)acrylate, butyl (meth)acrylate, pentyl (meth)acrylate, hexyl (meth)acrylate, heptyl (meth)acrylate, octyl (meth)acrylate and 2-ethylhexyl (meth)acrylate; (meth)acrylic acid derivatives such as dicyclopentanyl (meth)acrylate, benzyl (meth)acrylate, tetrahydrofurfuryl (meth)acrylic acid ester, dimethylaminoethyl (meth)acrylic acid ester, diethylaminoethyl (meth)acrylic acid ester and glycidyl (meth)acrylic acid ester; and maleic acid. The photopolymerizable monomers can be used solely or in combination with other one or more types.

The (a) component preferably contains at least one selected from among (meth)acrylic acid, methyl (meth)acrylate, ethyl (meth)acrylate, butyl (meth)acrylate, benzyl (meth)acrylate and glycidyl (meth)acrylic acid ester, as the above described photopolymerizable monomer, from the viewpoint of being excellent in flexibility.

Examples of the polymerization initiators for polymerizing the photopolymerizable monomer include radical polymerization initiators. Polymerization initiators which are used for a reversible addition fragmentation chain transfer polymerization (RAFT polymerization) can be appropriately used as the radical polymerization initiator.

Examples of the radical polymerization initiators include: peroxide initiators such as benzoyl peroxide, acetyl peroxide, lauroyl peroxide, di-tert-butyl peroxide, cumene hydroperoxide, tert-butyl hydroperoxide and dicumyl peroxide; and azo initiators such as AIBN (2,2'-azobisisobutyronitrile) and V-65 (azobisdimethylvaleronitrile). Among these, the azo initiators are preferable and the AIBN is more preferable, from the viewpoint of being capable of using a solvent with a low boiling point, resisting causing a side reaction, and the like.

The weight average molecular weight of the (a) component is preferably 10000 or more, more preferably 15000 or more, further preferably 20000 or more, and particularly preferably 30000 or more, from the viewpoint of being excellent in resolution. The weight average molecular weight of the (a) component is preferably 200000 or less, more preferably 150000 or less, and further preferably 100000 or less, from the viewpoint of being excellent in the resolution. The weight average molecular weight of the (a) component can be measured by a gel permeation chromatography method (GPC) on the following conditions with the use of a calibration curve of standard polystyrene.

[GPC Condition]

Pump: Hitachi L-6000 type (made by Hitachi, Ltd., product name)

Column: Gelpack GL-R420, Gelpack GL-R430, and Gelpack GL-R440 (all made by Hitachi Chemical Co., Ltd., product names)

Eluent: tetrahydrofuran

Measurement temperature: 40° C.

Flow rate: 2.05 mL/minute

Detector: Hitachi L-3300 type RI (made by Hitachi, Ltd., product name)

Photopolymerizable compounds having an ethylenic unsaturated group can be used as the photopolymerizable compound which is the (b) component. Examples of the photopolymerizable compounds having the ethylenic unsaturated group include monofunctional vinyl monomers, difunctional vinyl monomers, and polyfunctional vinyl monomers having at least three photopolymerizable ethylenic unsaturated groups. The (b) components can be used solely or in combination with other one or more types.

Examples of the monofunctional vinyl monomers include the above described photopolymerizable monomers. Among these, (meth)acrylic acid, alkyl (meth)acrylic acid esters, benzyl (meth)acrylate and glycidyl (meth)acrylic acid ester are preferable.

Examples of the difunctional vinyl monomers include polyethylene glycol di(meth)acrylate, trimethylolpropane di(meth)acrylate, polypropylene glycol di(meth)acrylate, 2,2-bis(4-(meth)acryloxy polyethoxy phenyl) propane), 2,2-bis(4-((meth)acryloxy polypropoxy)phenyl) propane, 2,2-bis(4-((meth)acryloxy polyethoxy polypropoxy)phenyl) propane, and bisphenol A diglycidyl ether di(meth)acrylate.

Examples of the polyfunctional vinyl monomers having at least three photopolymerizable ethylenic unsaturated groups include trimethylolpropane tri(meth)acrylate, tetramethylolmethane tri(meth)acrylate, tetramethylolmethane tetra(meth)acrylate, dipentaerythritol penta(meth)acrylate, dipentaerythritol hexa(meth)acrylate, and trimethylolpropane triglycidyl ether tri(meth)acrylate.

The (b) component preferably contains the polyfunctional vinyl monomer having at least three photopolymerizable ethylenic unsaturated groups, from the viewpoint of being excellent in adhesiveness with the base material (for instance, transparent base material) when the cured product is formed on the base material.

Examples of the photopolymerization initiators which are the (c) component include:

aromatic ketones such as benzophenone, N,N,N',N'-tetramethyl-4,4'-diaminobenzophenone (also known as Michler's ketone), 4-methoxy-4'-dimethylaminobenzophenone, 2-benzyl-2-dimethylamino-1-(4-morpholinophenyl)-1-butanone and 2-methyl-1-[4-(methylthio)phenyl]-2-morpholino-1-propanone;

benzoin ether compounds such as benzoin methyl ether, benzoin ethyl ether and benzoin phenyl ether;

benzoin compounds such as benzoin, methylbenzoin and ethylbenzoin;

oxime ester compounds such as 1,2-octanedione, 1-[4-(phenylthio)phenyl-, 2-(O-benzoyloxime)], ethanone, 1-[9-ethyl-6-(2-methylbenzoyl)-9H-carbazole-3-yl]-, 1-(O-acetyloxime);

phosphine oxide compounds such as 2,4,6-trimethylbenzoyl-diphenyl-phosphine oxide;

benzyl derivatives such as benzyl dimethyl ketal;

acridine derivatives such as 9-phenylacridine and 1,7-bis (9,9'-acridinyl)heptane; and N-phenylglycine, N-phenylglycine derivatives, coumarin-based compounds and oxazol-based compounds.

Among these, the oxime ester compound and the phosphine oxide compound are preferable, from the viewpoint of being excellent in transparency of the cured product (protective film and the like) to be formed, and being excellent in pattern forming capability (for instance, pattern forming capability at the time when thickness is 10 μm or less). The (c) components can be used solely or in combination with other one or more types.

The amount of the (a) component to be blended in the photosensitive layer 20 is preferably 40 parts by mass or more, and more preferably 50 parts by mass or more, with respect to 100 parts by mass of the total of the (a) component and the (b) component, from the viewpoint of being excellent in coating film properties, and suppressing edge fusion (phenomenon that resin bleeds from end of photosensitive element). The amount of the (a) component to be blended is preferably 80 parts by mass or less, and more preferably 70 parts by mass or less, with respect to 100 parts by mass of the total of the (a) component and the (b) component, from the viewpoint of suppressing the lowering of sensitivity and also suppressing the decrease of a mechanical strength.

The amount of the (b) component to be blended in the photosensitive layer 20 is preferably 20 parts by mass or more, and more preferably 30 parts by mass or more, with respect to 100 parts by mass of the total of the (a) component and the (b) component, from the viewpoint of enhancing a mechanical strength of the cured product (for instance, cured film). The amount of the (b) component to be blended is preferably 60 parts by mass or less, and more preferably 50 parts by mass or less, with respect to 100 parts by mass of the total of the (a) component and the (b) component, from the viewpoint of being excellent in coating film properties and suppressing the edge fusion (phenomenon that resin bleeds from end of photosensitive element).

The amount of the (c) component to be blended in the photosensitive layer 20 is preferably 0.1 parts by mass or more, and more preferably 0.2 parts by mass or more, with respect to 100 parts by mass of the total of the (a) component and the (b) component, from the viewpoint that sufficient sensitivity is obtained. The amount of the (c) component to be blended is preferably 20 parts by mass or less, and more preferably 10 parts by mass or less, with respect to 100 parts by mass of the total of the (a) component and the (b) component, from the viewpoint of suppressing a phenomenon that absorption on the surface of the composition increases at the time of light exposure, and that the photocuring of the inner part becomes insufficient.

The photosensitive layer 20 may contain: dyes such as malachite green; photochromic agents such as tribromomethylphenylsulfone and leuco crystal violet; plasticizers such as p-toluenesulfonamide; and polymerization inhibitors, heat coloring inhibitors, pigments, fillers, antifoaming agents, fire retardants, stabilizers, adhesiveness-imparting agents, leveling agents, peeling promoters, oxidation inhibitors, perfumes, imaging agents and heat crosslinking agents, as arbitrary components, as needed. The content of each of the arbitrary components is, for instance, 0.01 to 20 parts by mass, with respect to 100 parts by mass of the total of the (a) component and the (b) component. The above described arbitrary components can be used solely or in combination with other one or more types.

The photosensitive layer 20 can be formed by: obtaining a solution having approximately 30 to 60 mass % of the solid content by dissolving the constituent in a solvent such as methanol, ethanol, acetone, methyl ethyl ketone, methyl cellosolve, ethyl cellosolve, toluene, N,N-dimethylformamide, propylene glycol monomethyl ester, propylene glycol monomethyl ether acetate and dimethylacetamide or in a mixed solvent thereof; applying the solution onto the support film 10; and then drying the applied solution. Subsequently, on the photosensitive layer 20, the protective film 30 is laminated, and thereby the photosensitive element 1 is obtained.

The thickness (thickness after drying) of the photosensitive layer 20 is preferably less than 20 μm. In addition, the thickness of the photosensitive layer 20 is preferably the following thickness, from the viewpoint that an effect for suppressing the occurrence of the air bubble becomes easily obtained. Specifically, the thickness of the photosensitive layer 20 is preferably 1 μm or more, and more preferably 2 μm or more, from the viewpoint of suppressing the lowering of followability and suppressing the occurrence of a defect. The thickness of the photosensitive layer 20 is more preferably 15 μm or less, further preferably 10 μm or less, particularly preferably 9 μm or less, extremely preferably 8 μm or less, and very preferably 7 μm or less, from the viewpoint that the electronic component is easily thinned (for instance, in the case where it is used as structural member of electronic component such as touch panel which is strongly demanded to be thinned, electronic component is easily thinned). Incidentally, the thickness of the photosensitive layer 20 may also be 20 μm or more.

The viscosity of the photosensitive layer 20 at 30° C. is preferably 15 MP·s or more, and more preferably 25 MPa·s or more, from the viewpoint of suppressing the occurrence of edge fusion when the photosensitive element is wound around the core. The viscosity of the photosensitive layer 20 at 30° C. is preferably 50 MP·s or less, and more preferably 40 MPa·s or less, from the viewpoint that the lowering of resin fluidization is suppressed, and the occurrence of the air void becomes easily suppressed.

The protective film 30 is a polypropylene film. The protective film 30 has a principal surface (first surface) 30a at a side of the photosensitive layer 20, and a principal surface (second surface) 30b at an opposite side to the principal surface 30a, and the principal surface 30a and the principal surface 30b are smooth (both of surfaces are smooth).

The state that both of the principal surface 30a and the principal surface 30b are smooth can be checked by winding the photosensitive element 1 around the core, and then laminating the photosensitive layer 20. In the case where the principal surface 30a and the principal surface 30b have unevenness and are not smooth, the unevenness is transferred onto the photosensitive layer 20 and the air bubble is formed; but in the case where both of the principal surface 30a and the principal surface 30b are smooth, the unevenness is not transferred onto the photosensitive layer 20 and accordingly the formation of the air bubble is suppressed.

It can be checked whether both of the principal surface 30a and the principal surface 30b are smooth, by the following procedures. Firstly, the photosensitive element 1 is wound around the core (for instance, outer diameter of 84 mm and inner diameter of 76 mm) The photosensitive element 1 is wound around the core so that the support film 10 is arranged at the most outer side, for instance, with a tension of 90 N/m. Next, after the protective film 30 of the wound photosensitive element 1 has been peeled, a laminated product of the support film 10 and the photosensitive layer 20 (reference numeral F1 in FIG. 1) is transferred onto a PET film (reference numeral F2 in FIG. 1, while widths of support film 10 and photosensitive layer 20 are 99% of width of PET film) so that the photosensitive layer 20 of 500 mm comes in contact with the PET film (so that both ends of PET film in width direction are exposed from photosensitive layer 20, at approximately equal spaces, at lamination temperature of 90° C., with lamination speed of 2.0 m/minute and at roll linear pressure of 0.63 MPa), as is shown in FIG. 1. For instance, the width of the photosensitive layer 20 is 495 mm, the thickness of the PET film is 125 μm, and the width of the PET film is 500 mm. For instance, "A-4300" which is a product name and is made by TOYOBO CO., LTD. can be used as the PET film. Then, three predetermined measurement regions (Regions A1, A2 and A3 with 1 cm×1 cm shown in FIG. 1. Region A1: central part in length direction and width direction in whole photosensitive layer 20, region A2: central part in one region out of four regions partitioned by dividing photosensitive layer 20 into two regions in each of length direction and width direction, and region A3: central part in region in diagonal position to region A2.) on the principal surface of the photosensitive layer 20, which does not come in contact with the PET film, (principal surface of photosensitive layer 20, which comes in contact with support film 10), are observed with a microscope (20-times object lens). When the average number of air bubbles having a diameter of 10 μm or more, which is checked by such observation, is two pieces or less, it can be checked that both of the principal surface 30a and the principal surface 30 are smooth. A shape measuring laser microscope, for instance, can be used for the observation with the microscope.

An arithmetic mean roughness (Ra) of the principal surface 30a and the principal surface 30b is preferably 0.05 μm or less, more preferably 0.04 μm or less, further preferably 0.03 μm or less, and particularly preferably 0.02 μm or less, from the viewpoint of further suppressing the occurrence of the air bubble at the time of the lamination. The arithmetic mean roughness (Ra) may be 0 μm.

The maximum height (Rmax) of the principal surface 30a and the principal surface 30b is preferably 0.5 μm or less, more preferably 0.4 μm or less, and further preferably 0.35 μm or less, from the viewpoint of further suppressing the occurrence of the air bubble at the time of the lamination. The maximum height (Rmax) may be 0 μm.

The arithmetic mean roughness (Ra) and the maximum height (Rmax) of both of the surfaces of the protective film 30 can be measured, for instance, by the following procedures.

(a) A sample to be measured having a size of 5 cm×10 cm is cut out from the protective film.

(b) After one drop of water has been dripped on a flat glass substrate (10 cm×10 cm) with a dropping pipette, the sample to be measured is brought into pressure contact with the glass substrate so that the air bubble does not enter, with a clean roller.

(c) Both of the ends in the longitudinal direction of the sample to be measured are fixed by weights, and ten portions of measurement regions (region of 284.1 μm×213.1 μm) in the sample to be measured are arbitrarily selected.

(d) After the measurement regions are observed with a 50-times object lens with the use of the shape measuring laser microscope (VK-X200, made by KEYENCE CORPORATION), and also the arithmetic mean roughness (Ra) and the maximum height (Rmax) have been measured, the average value of the total 10 portions is calculated.

(e) The above described steps (a) to (d) are repeated, and the measurement values are acquired three times in total; and the average value of the repeated three times is adopted as the arithmetic mean roughness (Ra) and the maximum height (Rmax).

The thickness of the protective film 30 is preferably 1 μm or more, more preferably 5 μm or more, and further preferably 15 μm or more so that a sufficient strength of the protective film 30 is obtained, from the viewpoint of suppressing being ruptured when the protective film 30 is laminated on the photosensitive layer 20. The thickness of the protective film 30 is preferably 100 µm or less, more preferably 50 µm or less, further preferably 35 µm or less, and particularly preferably 30 µm or less, from the viewpoint of suppressing a rise in the price and also suppressing the occurrence of a wrinkle at the time when the protective film 30 is laminated.

Examples of the protective film 30 include E-201F (made by Oji F-Tex Co., Ltd., double-sided smooth polypropylene film).

An adhesive strength between the photosensitive layer 20 and the support film 10 is preferably larger than an adhesive strength between the photosensitive layer 20 and the protective film 30. If the adhesive strength between the photosensitive layer 20 and the support film 10 is not smaller than the adhesive strength between the photosensitive layer 20 and the protective film 30, the photosensitive layer 20 tends to be transferred onto the side of the protective film 30, when the protective film 30 is removed at the time of the lamination.

The photosensitive element 1 can be obtained, for instance, by applying the above described photosensitive resin composition onto the support film 10 and drying to form the photosensitive layer 20, and then by laminating the protective film 30 on the photosensitive layer 20.

The average light transmittance of the photosensitive element 1 in a wavelength region of 400 to 700 nm is preferably 80% or more, and more preferably 85% or more, from the viewpoint that the photosensitive element can be preferably used for an application for a touch panel to which transparency is required, and the like. The light transmittance can be measured with a UV spectrometer (for instance, 228A type W beam spectrophotometer and ultraviolet and visible spectrophotometer (U-3310) made by Hitachi, Ltd.), a turbidity meter (for instance, "NDH5000" which is product name and is made by NIPPON DENSHOKU INDUSTRIES Co., LTD.), and the like.

The thickness of the photosensitive element 1 is preferably 20 µm or more, and more preferably 30 µm or more, from the viewpoint of further suppressing the occurrence of the air bubble in laminate. The upper limit of the thickness of the photosensitive element 1 is, for instance, 100 µm.

In the photosensitive element 1, the photosensitive layer 20 may come in contact with the support film 10 and/or the protective film 30. On the other hand, in the photosensitive element according to the present embodiment, another layer (intermediate layer) may be laminated in between the support film 10 and the protective film 30, in addition to the photosensitive layer 20, and the photosensitive layer 20 does not need to come in contact with the support film 10 or the protective film 30. For instance, the photosensitive element (photosensitive electroconductive film) 1a shown in FIG. 5(*b*) further has (D) an electroconductive layer 40 which is arranged between the support film 10 and the photosensitive layer 20, in addition to the support film 10, the photosensitive layer 20 and the protective film 30. Incidentally, in the photosensitive element 1a, the electroconductive layer 40 may be impregnated with a component in the photosensitive resin composition of the photosensitive layer 20.

The photosensitive element according to the present embodiment can be used for forming the cured product (which is particularly permanent resist such as insulating film, spacer, protective member of touch panel and the like, and for instance, is cured film composed of cured film pattern of photosensitive resin composition). The photosensitive element according to the present embodiment can be used for manufacturing an electronic component. For instance, the photosensitive element according to the present embodiment can be used for forming the cured product of the electronic component having the cured product (protective member and the like). The photosensitive element according to the present embodiment can be used for forming the cured product (for instance, resist pattern such as resin cured product pattern) on a base material (for instance, transparent base material). The photosensitive element according to the present embodiment can be used for manufacturing the touch panel. For instance, the photosensitive element according to the present embodiment can be used for forming the protective film (for instance, resist pattern such as resin cured product pattern) on the base material for the touch panel.

(Photosensitive Element Roll)

The photosensitive element 1 may be stored in any form, but can be usually stored in a form of being wound in a rolled form around a core having a cylindrical shape or the like. The photosensitive element roll according to the present embodiment includes the core, and the photosensitive element which is wound around the core, wherein the photosensitive element is the photosensitive element according to the present embodiment. The material of the core is not limited in particular as long as the material is conventionally used, and the examples include plastics such as a polyethylene resin, a polypropylene resin, a polystyrene resin, a polyvinyl chloride resin, and an ABS resin (acrylonitrile-butadiene-styrene copolymer). When being stored, it is preferably wound so that the support film becomes the most outer side. An end face separator is preferably provided on an end face of the photosensitive element roll which is prepared by winding the photosensitive element in the rolled form, from the viewpoint of protecting the end face. In addition, a moisture-proof end face separator is preferably provided on the end face of the photosensitive element roll, from the viewpoint of edge fusion resistance. When being packed, the photosensitive element roll is preferably packed in a form of being wrapped with a black sheet having small moisture permeability.

(Method for Producing Resist Pattern)

The method for producing (forming) the resist pattern according to the present embodiment includes a lamination step, a light exposure step and a development step, in this order. The method using the photosensitive element 1 will be described below, as one example.

In the lamination step, the protective film 30 of the photosensitive element 1 is peeled, and then the photosensitive layer 20 and the support film 10 are laminated on a base material (substrate or the like). The photosensitive layer 20 and the support film 10 are laminated on the base material so that the photosensitive layer 20 and the support film 10 are arranged on the base material in this order.

The materials of the surface of the base material (uneven surface) on which the photosensitive element 1 is laminated are not limited in particular, but include, for instance, glass, silicon and metal.

The heating temperature of the photosensitive layer 20 in the lamination step is preferably 50 to 130° C., and more preferably 90 to 130° C. A pressure-bonding pressure (roll linear pressure) is preferably 0.1 to 1.0 MPa (1 to 10 kgf/cm$^2$). However, the heating temperature and the pressure-bonding pressure are not limited to the above described conditions. When the photosensitive layer 20 is heated to 50 to 130° C. as in the above description, the base material having the fine uneven structure does not necessarily need to be subjected to preheating treatment beforehand, but the base material can also be subjected to the preheating treatment so as to further enhance lamination properties.

In the light exposure step, a predetermined portion of the photosensitive layer 20 is irradiated with active rays to form a photo-cured portion on the photosensitive layer 20. When the support film 10 is transparent which exists on the photosensitive layer 20, the photosensitive layer 20 may be irradiated with the active rays through the support film 10. When the support film 10 is opaque, the support film 10 is removed. The support film 10 is preferably transparent, from the viewpoint of protecting the photosensitive layer 20.

A known light source (for instance, light source which effectively emits ultraviolet rays, such as carbon arc lamp, mercury vapor arc lamp, ultrahigh pressure mercury lamp, high pressure mercury lamp and xenon lamp) is used as the light source of the active rays. In addition to the above, a light source which effectively emits visible light such as a flood electric bulb for photography and a solar lamp can also be used.

In the development step, a portion other than the photo-cured portion in the photosensitive layer 20 is removed to obtain the resist pattern. In the development step, after the light exposure step, the support film 10 is removed, as needed. The peeling step is generally performed by hands, but can be efficiently processed by using some jig or machine.

The resist pattern may be further cured by being subjected to a heating treatment of approximately 80 to 250° C., as needed. The heating treatment may be performed before the support film 10 is peeled from the photosensitive layer 20, or may be performed after the support film 10 has been peeled from the photosensitive layer 20.

(Electronic Component and Method for Manufacturing the Same)

An electronic component according to the present embodiment comprises a cured product (cured film or the like) of the photosensitive layer of the photosensitive element according to the present embodiment. The electronic component comprises the above described cured product, for instance, as a protective member (protective film or the like). The electronic component according to the present embodiment comprises, for instance, the resist pattern which is obtained by the above described method for producing the resist pattern. Examples of the electronic component include a touch panel, a liquid crystal display, organic electroluminescence, a solar cell module, a printed wiring board, and electronic paper. The electronic component which is obtained by using the photosensitive element and the method for manufacturing the same (example of use of resist pattern, and portion of use of protective film) will be further described below.

One example of the touch panel and the method for manufacturing the same will be described below with reference to FIG. 6 and FIG. 7, as a first embodiment of the electronic component which is obtained by using the photosensitive element and the method for manufacturing the same. FIG. 6 and FIG. 7 are schematic sectional views for describing the method for manufacturing a base material for the touch panel (touch sensor) provided with the cured film (protective film).

Firstly, as is shown in FIG. 6(a), a photosensitive element 1b is prepared. Next, as is shown in FIG. 6(b), the protective film 30 of the photosensitive element 1b is peeled, and then the support film 10 and the photosensitive layer 20 are laminated on electrodes (electrodes for touch panels) 210 and 220 which are arranged on the base material (base material for touch panel) 200. Subsequently, as is shown in FIG. 7(a), a predetermined portion of the photosensitive layer 20 is irradiated with active rays L through a photomask 230 to form a photo-cured portion. Then, after the irradiation with the active rays L, a portion other than the photo-cured portion in the photosensitive layer 20 (portion of photosensitive layer 20, which has not been irradiated with active rays L) is removed. Thereby, as is shown in FIG. 7(b), a protective film 22 is formed which covers at least a part of the electrodes 210 and 220. A base material 300 for the touch panel provided with the cured film is obtained according to the above.

Next, one example of a touch panel and a method for manufacturing the same will be described below with reference to FIG. 8 to FIG. 10, as a second embodiment of the electronic component which is obtained by using the photosensitive element, and of the method for manufacturing the same. FIG. 8 is a schematic plan view showing one example of an electrostatic capacity type touch panel. FIG. 9 is a partial sectional view showing one example of the electrostatic capacity type touch panel; FIG. 9(a) is a partial sectional view of a region C taken along the IXa-Ixa line in FIG. 8; and FIG. 9(b) is a partial sectional view showing another aspect which is different from FIG. 9(a). FIG. 10 is a schematic plan view showing another example of the electrostatic capacity type touch panel.

The touch panel (electrostatic capacity type touch panel) 400 shown in FIG. 8 and FIG. 9(a) has a touch screen 402 for detecting touch position coordinates, on one surface of a transparent substrate (transparent base material, base material for touch panel) 401. On the transparent substrate 401, a transparent electrode 403 and a transparent electrode 404 are alternately arranged for detecting a change of the electrostatic capacitance in the region of the touch screen 402. The transparent electrodes 403 and 404 each detect the change of the electrostatic capacitance of a touched position. Thereby, the transparent electrode 403 detects a signal of an X position coordinate, and the transparent electrode 404 detects a signal of a Y position coordinate.

On the transparent substrate 401, drawing wires 405 are arranged for transmitting a detected signal at the touched position, which has been detected by the transparent electrodes 403 and 404, to an external circuit. The drawing wire 405 and the transparent electrodes 403 and 404 are directly connected, and are also connected through the connection electrode 406 which are arranged on the transparent electrodes 403 and 404 (see FIG. 9(a)). Incidentally, as is shown in FIG. 9(b), the drawing wire 405 and the transparent electrodes 403 and 404 may be directly connected not through the connection electrode 406. One end of the drawing wire 405 is connected to the transparent electrodes 403 or 404, and the other end of the drawing wire 405 is connected to the connection terminal 407 for being connected to the external circuit.

On the drawing wire 405, the connection electrode 406 and the connection terminal 407, a protective film (resin cured film pattern) 422 is arranged. In the cross section shown in FIG. 9(a), a part of the transparent electrode 404 and the whole of the drawing wire 405 and the connection electrode 406 are covered with the protective film 422. The photosensitive element according to the present embodiment can be preferably used for forming a cured product (resin cured film pattern) as the protective film 422 for protecting the drawing wire 405, the connection electrode 406 and the connection terminal 407.

In addition, such a protective film 422 can also simultaneously protect an electrode in a sensing region. For instance, in FIG. 8, the protective film 422 protects the drawing wire 405, the connection electrode 406, a part of the electrode in the sensing region, and a part of the connection terminal 407. A position in which the protective film is arranged may be appropriately changed. For instance, a protective film 423 may be arranged so as to protect all of the touch screen 402, as is shown in FIG. 10.

A method for manufacturing the touch panel 400 using the photosensitive element according to the present embodiment will be described below. Firstly, on the transparent substrate 401, the transparent electrode 403 for detecting the X position coordinate is formed. Subsequently, the transparent electrode 404 for detecting the Y position coordinate is formed through an insulating layer (not shown). For instance, a method for etching a transparent electrode layer which is arranged on the transparent substrate 401 can be used as a method for forming the transparent electrodes 403 and 404.

Next, on the transparent substrate 401, the drawing wire 405 for being connected to the external circuit, and the connection electrode 406 for connecting the drawing wire 405 with the transparent electrodes 403 and 404 therethrough are formed. The drawing wire 405 and the connection electrode 406 may be formed after the transparent electrodes 403 and 404 have been formed, or may also be simultaneously formed when the transparent electrodes 403 and 404 are formed. A method of etching after metal sputtering, for instance, can be used as a method for forming the drawing wire 405 and the connection electrode 406. The drawing wire 405 can be simultaneously formed when the connection electrode 406 is formed, for instance, by a screen printing method with the use of an electroconductive paste material containing flake-shaped silver. Next, the connection terminal 407 is formed for connecting the drawing wire 405 with the external circuit.

The photosensitive layer of the photosensitive element according to the present embodiment is pressure-bonded so as to cover the transparent electrode 403, the transparent electrode 404, the drawing wire 405, the connection electrode 406 and the connection terminal 407 which have been formed according to the above described steps, to transfer the photosensitive layer 20 onto these structural members. Next, the photosensitive layer 20 is irradiated with active rays in a patterned form through a photomask having a desired shape to form a photo-cured portion. After the irradiation with the active rays, development is performed to remove a portion other than the photo-cured portion in the photosensitive layer 20. Thereby, the protective film 422 which is composed of the photo-cured portion of the photosensitive layer 20 is formed. The touch panel provided with the protective film 422 (touch panel having base material for touch panel, which is provided with the protective film 422) 400 can be manufactured according to the above.

Next, one example of an electrostatic capacity type touch panel in which the transparent electrodes exist on the same plane and a method for manufacturing the same will be described below with reference to FIG. 11 to FIG. 15, as a third embodiment of the electronic component which is obtained by using the photosensitive element and the method for manufacturing the same. FIG. 11 is a schematic plan view showing one example of the touch panel. FIG. 12 is a partial cutaway perspective view of FIG. 11. FIG. 13 is a partial sectional view taken along the line XIII-XIII of FIG. 12. FIG. 14 is a partial cutaway perspective view for describing the method for manufacturing the touch panel; FIG. 14(a) is a partial cutaway perspective view showing a substrate which is provided with transparent electrodes; and FIG. 14(b) is a partial cutaway perspective view showing the electrostatic capacity type touch panel. FIG. 15 is a partial sectional view for describing the method for manufacturing the touch panel; FIG. 15(a) is a partial sectional view taken along the line XVa-XVa of FIG. 14 (a); FIG. 15(b) is a partial sectional view showing a step of forming an insulating film; and FIG. 15(c) is a partial sectional view taken along the line XVc-XVc line of FIG. 14(b).

The touch panel (electrostatic capacity type touch panel) 500 shown in FIG. 11 to FIG. 13 has a transparent electrode 503 and a transparent electrode 504 which detect the change of the electrostatic capacitance, on a transparent substrate (transparent base material, base material for touch panel) 501. The transparent electrode 503 detects a signal of the X position coordinate. The transparent electrode 504 detects a signal of the Y position coordinate. The transparent electrode 503 and the transparent electrode 504 exist on the same plane. A drawing wire 505a and a drawing wire 505b for being connected to a control circuit of a driver element circuit (not shown) which controls an electric signal functioning as a touch panel are connected to the transparent electrodes 503 and 504. In a portion in which the transparent electrode 503 and the transparent electrode 504 cross, an insulating film 524 is arranged between the transparent electrode 503 and the transparent electrode 504.

A method for manufacturing the touch panel 500 will be described below with reference to FIG. 14 and FIG. 15. In the method for manufacturing the touch panel 500, for instance, such a substrate may be used that the transparent electrode 503 and electroconductive material portions for forming the transparent electrode 504 thereon are previously formed on the transparent substrate 501 according to a known method using a transparent electroconductive material. For instance, as is shown in FIG. 14(a) and FIG. 15(a), a substrate is prepared on which the transparent electrode 503 and an electroconductive material portion 504a for forming the transparent electrode 504 is formed beforehand. Next, as shown in FIG. 15 (b), an insulating film 524 is formed on a part of the transparent electrode 503 (portion which is sandwiched between electroconductive material portions 504a on transparent electrode 503) in which the transparent electrode 503 and transparent electrode 504 consequently shall cross, by subjecting the photosensitive layer of the photosensitive element according to the present embodiment to light exposure and development. Subsequently, as shown in FIG. 14(b) and FIG. 15(c), an electroconductive pattern is formed on the insulating film 524 as a bridge portion 504b of the transparent electrode 504, according to a known method. The transparent electrode 504 is formed by making the electroconductive material portions 504a conduct to each other through the bridge portion 504b. Then, the drawing wires 505a and 505b are formed, and thereby the touch panel 500 is obtained. The photosensitive element according to the present embodiment can be preferably used for forming the cured product (resin cured film pattern) as the insulating film 524.

The transparent electrodes 503 and 504 may be formed, for instance, according to a known method using ITO or the like. The drawing wires 505a and 505b can be formed according to a known method using metal such as Cu and Ag, in addition to the transparent electroconductive material. In addition, in the method for manufacturing the touch panel 500, a substrate may be used in which the drawing wires 505a and 505b are formed beforehand.

Next, one example of a touch panel will be described below with reference to FIG. 16, as a fourth embodiment of the electronic component which is obtained by using the photosensitive element. FIG. 16 is a partial plan view showing one example of the touch panel. The touch panel 600 shown in FIG. 16 intends to narrow the frame of the touch panel.

The touch panel 600 has a transparent substrate (transparent base material, base material for touch panel) 601, a transparent electrode 604, a wire (transparent electrode wire) 604a, a drawing wire 605, and an insulating film (insulating film, for instance, transparent insulating film) 625. The transparent electrode 604 and the wire 604a are arranged on the transparent substrate 601. The wire 604a extends from the transparent electrode 604. The insulating film 625 is arranged on the end of the transparent electrode 604 and the wire 604a. The drawing wire 605 is arranged on the insulating film 625. An opening 608 is formed in the insulating film 625 on the upside of the end of a part of the transparent electrodes 604. The transparent electrode 604 and the drawing wire 605 are connected and conducted to each other through the opening 608. The photosensitive element according to the present embodiment can be preferably used for forming the cured product (resin cured film pattern) as the insulating film 625.

EXAMPLES

The present invention will be described in detail below with reference to examples, but the present invention is not limited to the examples.

<Preparation of Solution of Photosensitive Resin Composition>

A binder polymer solution was prepared in the following way. Firstly, a component (1) shown in Table 1 was charged into a flask which is provided with a stirrer, a reflux cooler, an inert gas introduction port and a thermometer, and the temperature was raised to 80° C. under a nitrogen gas atmosphere. A component (2) shown in Table 1 was uniformly dripped for 4 hours while a reaction temperature was kept at 80° C.±2° C. After the component (2) was dripped, stirring was continued at 80° C.±2° C. for 6 hours, and thereby the binder polymer solution (45 mass % of solid content) was obtained of which the weight average molecular weight (Mw) was approximately 80000.

TABLE 1

|     | Component | Blending amount (parts by mass) |
| --- | --- | --- |
| (1) | Propylene glycol monomethyl ether | 62 |
|     | Toluene | 62 |
| (2) | Methacrylic acid | 12 |
|     | Methyl methacrylate | 58 |
|     | Ethyl acrylate | 30 |
|     | 2,2'-azobisisobutyronitrile | 1.2 |

Incidentally, the weight average molecular weight was obtained by measurement with a gel permeation chromatography method (GPC method) on the following conditions, and conversion with the use of a calibration curve of standard polystyrene.

[GPC Conditions]

Pump: Hitachi L-6000 type (product name, made by Hitachi, Ltd.)

Column: Gelpack GL-R420, Gelpack GL-R430, Gelpack GL-R440 (all product names made by Hitachi Chemical Co., Ltd.)

Eluent: tetrahydrofuran

Measurement temperature: 40° C.

Flow rate: 2.05 mL/minute

Detector: Hitachi L-3300 type RI (product name, made by Hitachi, Ltd.)

Each component shown in the following table 2 was mixed in a blending amount (of which unit is parts by mass) shown in Table 2, and thereby the solution of the photosensitive resin composition was prepared. Incidentally, the binder polymer solution which was synthesized in the above description was mixed so that a mass (solid content) of a nonvolatile content in the (a) component became the blending amount shown in Table 2.

TABLE 2

| Constituent of photosensitive layer | | Blending amount (parts by mass) |
| --- | --- | --- |
| (a) Binder polymer | PM-300 | 60 |
| (b) Photopolymerizable compound | TMPTA | 40 |
| (c) Photopolymerization initiator | OXE-01 | 2.5 |
| Other components | AW-500 | 0.1 |
|  | SH-30 | 0.07 |

The details of each of the components in Table 2 are as follows.

(a) Binder polymer

PM-300: binder polymer which was synthesized in the above description (b) Photopolymerizable compound TMPTA: trimethylolpropane triacrylate (made by Nippon Kayaku Co., Ltd.)

(c) Photopolymerization initiator

OXE-01: 1,2-octanedione, 1-[4-(phenylthio)phenyl-, 2-(O-benzoyloxime)] (made by BASF)

(Other components)

AW-500: Phenol-based polymerization inhibitor (made by Kawaguchi Chemical Industry Co., Ltd.)

SH-30: Silicone leveling agent (made by Dow Corning Toray Co., Ltd.)

Production of Photosensitive Element

Example 1

The solution of the photosensitive resin composition which was obtained in the above description was uniformly applied on a polyethylene terephthalate film (product name "Cosmo Shine A-1517" made by TOYOBO CO., LTD.) with a thickness of 16 μm. Drying treatment was sequentially conducted in hot air convection type driers of 70° C. and 110° C., and thereby a photosensitive layer was formed of which the thickness after having been dried was 5 μm. The photosensitive layer and the protective film (product name "E-201F" made by Oji F-Tex Co., Ltd.) were laminated on each other, and thereby a photosensitive element was obtained in which the polyethylene terephthalate film (support film), the photosensitive layer and the protective film were laminated in this order. The obtained photosensitive element was wound in a rolled form around a core having a cylindrical shape (outer diameter of 84 mm and inner diameter of 76 mm) so that the support film was arranged at the most outer side, with a tension of 90 N/m.

Examples 2 to 4, and Comparative Examples 1 to 6

The photosensitive element was obtained in a similar way to that in Example 1, except that a protective film shown in Table 3 was used in place of the protective film (product name "E-201F" made by Oji F-Tex Co., Ltd.).

<Measurement of Surface Roughness>

The arithmetic mean roughness (Ra) and the maximum height (Rmax) of both of the surfaces of the protective film were measured according to the following procedures.

(a) A sample to be measured having a size of 5 cm×10 cm was cut out from the protective film.

(b) After one drop of water was dripped on a flat glass substrate (10 cm×10 cm) with a dropping pipette, the sample to be measured was brought into pressure contact with the glass substrate so that the air bubble did not enter, with a clean roller.

(c) Both of the ends in the longitudinal direction of the sample to be measured were fixed by weights, and ten portions of measurement regions (region of 284.1 μm×213.1 μm) in the sample to be measured were arbitrarily selected.

(d) After the measurement regions were observed with a 50-times object lens with the use of the shape measuring laser microscope (VK-X200 made by KEYENCE CORPORATION), and also the arithmetic mean roughness (Ra) and the maximum height (Rmax) were measured, the average value of the total 10 portions was calculated.

(e) The above described steps (a) to (d) were repeated to acquire the measurement values three times in total; and the average value of the repeated three times was adopted as the arithmetic mean roughness (Ra) and the maximum height (Rmax).

<Measurement of Average Light Transmittance>

The average light transmittance of the photosensitive element in a wavelength region of the 400 to 700 μm was measured with the use of a UV spectrometer (228A type W beam spectrophotometer made by Hitachi, Ltd.)

<Evaluation of Air Bubble (Void) in Laminate>

The protective film was peeled off, and then, as shown in FIG. 1, a photosensitive layer of a photosensitive element (width of 495 mm) of 500 mm was transferred onto a base material (PET film with thickness of 125 μm and width of 500 mm, product name "A-4300" made by TOYOBO CO., LTD.) on the following lamination conditions. The support film was peeled off, then the surfaces of three predetermined measurement regions (Regions A1, A2 and A3 each with 1 cm×1 cm shown in FIG. 1) on the principal surface of the photosensitive layer, which does not come in contact with the base material, were observed with a microscope (20-times object lens), and the average number of the air bubbles in laminate having a diameter of 10 μm or more was evaluated.

[Lamination Conditions]

Temperature of laminate rolls: 90° C. (both of upper and lower rolls)

Lamination speed; 2.0 m/minute

Roll linear pressure: 0.63 MPa

The evaluation results of Examples 1 to 4 and Comparative examples 1 to 6 are shown in Table 3. Incidentally, in the columns of the arithmetic mean roughness (Ra) and the maximum height (Rmax), "first surface" is the surface of the protective film, which comes in contact with the photosensitive layer, and "second surface" is the surface of the protective film, which does not come in contact with the photosensitive layer.

In addition, one example of the observation results of Example 1 and Comparative example 1 in the evaluation of the air bubble in laminate is shown in FIG. 17. FIG. 17(a) is the observation result of Example 1, and FIG. 17(b) is the observation result of Comparative example 1.

TABLE 3

| Item | Protective film | Thickness of protective film (μm) | Thickness of photosensitive element (μm) | Ra (μm) (First surface/ second surface) | Rmax (μm) (First surface/ second surface) | Average transmittance (%) | Number of air bubbles in laminate (pieces/cm$^2$) |
|---|---|---|---|---|---|---|---|
| Example 1 | E-201F | 30 | 51 | 0.05/0.05 | 0.5/0.5 | 89.83 | None |
| Example 2 | OPP film A | 25 | 46 | 0.02/0.02 | 0.26/0.26 | 89.78 | 1 |
| Example 3 | OPP film B | 20 | 41 | 0.04/0.04 | 0.35/0.35 | 89.64 | 2 |
| Example 4 | OPP film C | 15 | 36 | 0.03/0.03 | 0.31/0.31 | 87.66 | 2 |
| Comparative example 1 | NF-15 | 20 | 41 | 0.08/0.08 | 3.2/3.2 | 89.35 | 12 |
| Comparative example 2 | E-200C | 20 | 41 | 0.12/0.11 | 0.67/0.99 | 89.73 | >100 |
| Comparative example 3 | E-201 | 12 | 33 | 0.05/0.09 | 0.50/0.61 | 89.75 | >100 |
| Comparative example 4 | EM-501 | 15 | 36 | 0.10/0.10 | 1.5/1.0 | 88.38 | >100 |
| Comparative example 5 | MA-411 | 15 | 36 | 0.45/0.05 | 4.0/0.5 | 87.62 | >100 |
| Comparative example 6 | MA-420 | 35 | 56 | 0.10/0.10 | 1.0/1.0 | 87.93 | >100 |

The details of the protective film shown in Table 3 are as follows.

E-201F: double-sided smooth polypropylene film (made by Oji F-Tex Co., Ltd.)

OPP film A: polypropylene film (sample product)

OPP film B: polypropylene film (sample product)

OPP Film C: polypropylene film (sample product)

NF-15: double-sided uneven polyethylene film (made by TAMAPOLY CO., LTD.)

E-200C: double-sided uneven polypropylene film (made by Oji Paper Co., Ltd.)

E-201: single-sided smooth polypropylene film (made by Oji F-Tex Co., Ltd.)

EM-501: double-sided finely roughened polypropylene film (made by Oji F-Tex Co., Ltd.)

MA-411: highly-roughened/smooth polypropylene film (made by Oji F-Tex Co., Ltd.)

MA-420: roughened/roughened polypropylene film (made by Oji F-Tex Co., Ltd.)

As is shown in Table 3, the use of the photosensitive element having the protective film of which the both of the surfaces are smooth can suppress the occurrence of the air bubble at the time of the lamination, even when the photosensitive element has the thin photosensitive layer.

Example 5

The thickness of the photosensitive layer of Example 1 was changed to 20 μm, and the photosensitive element was obtained in a similar way to that in Example 1. The obtained photosensitive element was wound in a rolled form around a core having a cylindrical shape, then the occurrence of the air bubble in laminate was checked in a similar way to that in Example 1, and as a result, the air bubble was not formed.

INDUSTRIAL APPLICABILITY

According to the present invention, it is possible to suppress the occurrence of the air bubble at the time of lamination, even when the photosensitive element has the thin photosensitive layer. According to the present invention, it is possible to suppress the occurrence of the air bubble at the time of the lamination, even when the photosensitive element has the photosensitive layer of 10 μm or less, in particular.

REFERENCE SIGNS LIST 1, 1a, 1b, 100 . . . photosensitive element, 10, 110 . . . support film, 20, 120 . . . photosensitive layer, 22, 422, 423 . . . protective film, 30, 130 . . . protective film, 30a, 130a . . . principal surface (first surface), 30b, 130b . . . principal surface (second surface), 40 . . . electroconductive layer, 200 . . . base material for touch panel, 210, 220 . . . electrode for touch panel, 230 . . . photomask, 300 . . . base material for touch panel provided with cured film, 400, 500, 600 . . . touch panel, 401, 501, 601 . . . transparent substrate, 402 . . . touch screen, 403, 404, 503, 504, 604 . . . transparent electrode, 405, 505a, 505b, 605 . . . drawing wire, 406 . . . connection electrode, 407 . . . connection terminal, 504a . . . electroconductive material portion, 504b . . . bridge portion, 524, 625 . . . insulating film, 604a . . . transparent electrode wire, 608 . . . opening, A, B . . . unevenness, A1, A2, A3 . . . measurement region, C . . . region, F1 . . . photosensitive layer, F2 . . . PET film, and L . . . active rays.

The invention claimed is:

1. A photosensitive element, comprising:
a support film;
a polypropylene film; and
a photosensitive layer arranged between the support film and the polypropylene film, wherein
the polypropylene film has a first surface at a side of the photosensitive layer and a second surface at an opposite side to the first surface, and
an arithmetic mean roughness Ra of the first surface and the second surface is 0.05 μm or less.

2. A photosensitive element, comprising:
a support film;
a polypropylene film; and
a photosensitive layer arranged between the support film and the polypropylene film, wherein
the polypropylene film has a first surface at a side of the photosensitive layer and a second surface at an opposite side to the first surface, and
a maximum height Rmax of the first surface and the second surface is 0.5 μm or less.

3. The photosensitive element according to claim 1, wherein a thickness of the photosensitive layer is less than 20 μm.

4. The photosensitive element according to claim 1, wherein a thickness of the photosensitive layer is 10 μm or less.

5. The photosensitive element according to claim 1, wherein an average light transmittance is 80% or more in a wavelength region of 400 to 700 nm.

6. The photosensitive element according to claim 1, wherein the photosensitive layer contains a binder polymer, a photopolymerizable compound and a photopolymerization initiator.

7. A method for producing a cured product, comprising:
a step of peeling the polypropylene film of the photosensitive element according to claim 1;
and then laminating the photosensitive layer and the support film on a base material; and
a step of irradiating the photosensitive layer with an active ray to form a photo-cured portion.

8. A photosensitive element roll, comprising:
a core, and
a photosensitive element which is wound around the core, wherein
the photosensitive element is the photosensitive element according to claim 1.

9. A method for producing a resist pattern, comprising:
a step of peeling the polypropylene film of the photosensitive element according to claim 1, and then laminating the photosensitive layer and the support film on a base material;
a step of irradiating a predetermined portion of the photosensitive layer with an active ray to form a photo-cured portion; and
a step of removing a portion other than the photo-cured portion in the photosensitive layer.

10. An electronic component, comprising a resist pattern obtained by the method for producing the resist pattern according to claim 9.

11. The photosensitive element according to claim 2, wherein a thickness of the photosensitive layer is less than 20 μm.

12. The photosensitive element according to claim 2, wherein a thickness of the photosensitive layer is 10 μm or less.

13. The photosensitive element according to claim 2, wherein an average light transmittance is 80% or more in a wavelength region of 400 to 700 nm.

14. The photosensitive element according to claim 2, wherein the photosensitive layer contains a binder polymer, a photopolymerizable compound and a photopolymerization initiator.

15. A method for producing a cured product, comprising:
a step of peeling the polypropylene film of the photosensitive element according to claim 2;
and then laminating the photosensitive layer and the support film on a base material; and
a step of irradiating the photosensitive layer with an active ray to form a photo-cured portion.

16. A photosensitive element roll, comprising:
a core, and
a photosensitive element which is wound around the core, wherein the photosensitive element is the photosensitive element according to claim 2.

17. A method for producing a resist pattern, comprising:
a step of peeling the polypropylene film of the photosensitive element according to claim 2, and then laminating the photosensitive layer and the support film on a base material;

a step of irradiating a predetermined portion of the photosensitive layer with an active ray to form a photo-cured portion; and a step of removing a portion other than the photo-cured portion in the photosensitive layer.

18. An electronic component, comprising a resist pattern obtained by the method for producing the resist pattern according to claim 17.

\* \* \* \* \*